(12) United States Patent
Lesso et al.

(10) Patent No.: US 11,731,163 B2
(45) Date of Patent: Aug. 22, 2023

(54) DRIVER CIRCUITRY FOR PIEZOELECTRIC TRANSDUCERS

(71) Applicant: Cirrus Logic International Semiconductor Ltd., Edinburgh (GB)

(72) Inventors: John P. Lesso, Edinburgh (GB); Toru Ido, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 534 days.

(21) Appl. No.: 16/989,050

(22) Filed: Aug. 10, 2020

(65) Prior Publication Data

US 2022/0040731 A1 Feb. 10, 2022

(51) Int. Cl.
| | |
|---|---|
| *H01L 41/04* | (2006.01) |
| *B06B 1/02* | (2006.01) |
| *H02M 3/07* | (2006.01) |
| *H10N 30/20* | (2023.01) |
| *H10N 30/80* | (2023.01) |

(52) U.S. Cl.
CPC ............. *B06B 1/0207* (2013.01); *H02M 3/07* (2013.01); *H10N 30/20* (2023.02); *H10N 30/802* (2023.02)

(58) Field of Classification Search
CPC .... B06B 1/0207; H10N 30/802; H01L 41/042
USPC ........................................................ 310/317
See application file for complete search history.

(56) References Cited

U.S. PATENT DOCUMENTS

| | | | |
|---|---|---|---|
| 2008/0272833 A1 | 11/2008 | Ivanov et al. | |
| 2009/0102439 A1 | 4/2009 | Williams | |
| 2009/0146528 A1* | 6/2009 | Bachmaier | ............... H02N 2/06 310/317 |
| 2019/0306641 A1 | 10/2019 | Wilson | |

OTHER PUBLICATIONS

International Search Report and Written Opinion of the International Searching Authority, International Application No. PCT/GB2021/051903, dated Oct. 21, 2021.

* cited by examiner

*Primary Examiner* — Derek J Rosenau
(74) *Attorney, Agent, or Firm* — Jackson Walker L.L.P

(57) ABSTRACT

The present disclosure relates to circuitry for driving a piezoelectric transducer based on an input signal. The circuitry comprises: primary driver circuitry configured to receive the input signal and to output a primary driving signal to the piezoelectric transducer based on the input signal; and secondary driver circuitry configured to receive an error signal indicative of an error between the input signal and the primary driving signal and to output a secondary driving signal to the piezoelectric transducer based on the error signal, wherein the primary driver circuitry and the secondary driver circuitry both comprise switching converter circuitry.

36 Claims, 16 Drawing Sheets

DRIVER CIRCUITRY FOR PIEZOELECTRIC TRANSDUCERS

FIELD OF THE INVENTION

The present disclosure relates to driver circuitry for piezoelectric transducers.

BACKGROUND

Piezoelectric transducers are increasingly being seen as a viable alternative to transducers such as speakers and resonant actuators for providing audio and/or haptic outputs in devices such as mobile telephones, laptop and tablet computers and the like, due to their thin form factor, which may be beneficial in meeting the demand for increasing functionality in such devices without significantly increasing their size. Piezoelectric transducers are also increasingly finding application as transducers for ultrasonic sensing and range-finding systems.

Piezoelectric transducers can be voltage-driven. However, when driven by voltage piezoelectric transducers exhibit both hysteresis and creep, which means that when driven by voltage the displacement of a piezoelectric transducer depends on both the currently-applied voltage and on a previously-applied voltage. Thus, for any given driving voltage there are multiple possible displacements of the piezoelectric transducer. For audio applications this manifests as distortion.

One way of reducing hysteresis and creep and the associated problems in a piezoelectric transducers is to drive the transducer with charge instead of voltage. When driven with charge, the displacement of the piezoelectric transducer varies with the charge applied.

FIG. 1 is a schematic illustration of circuitry for driving a piezoelectric transducer with charge. As shown generally at 100 in FIG. 1, charge drive circuitry 102, which may be charge pump circuitry, for example, may receive an electrical input signal (e.g. an input audio or ultrasonic signal or haptic waveform) from upstream circuitry (not shown) such as amplifier circuitry, and drive a piezoelectric transducer 104 to cause the piezoelectric transducer 104 to produce an audible, ultrasonic or haptic output based on the electrical input signal.

SUMMARY

According to a first aspect, the invention provides circuitry for driving a piezoelectric transducer based on an input signal, the circuitry comprising:
  primary driver circuitry configured to receive the input signal and to output a primary driving signal to the piezoelectric transducer based on the input signal; and
  secondary driver circuitry configured to receive an error signal indicative of an error between the input signal and the primary driving signal and to output a secondary driving signal to the piezoelectric transducer based on the error signal,
  wherein the primary driver circuitry and the secondary driver circuitry both comprise switching converter circuitry.

In one example, the primary driver circuitry comprises variable voltage power supply circuitry and the secondary driver circuitry comprises charge pump circuitry.

The variable voltage power supply circuitry may comprise a switch network, an inductor and a reservoir capacitor.

The charge pump circuitry may comprise a switch network and a flying capacitor.

The flying capacitor may be variable.

The charge pump circuitry may be configured to receive a power supply that varies based on a parameter of the input signal.

The variable voltage power supply circuitry may be configured to provide the power supply to the charge pump circuitry.

The variable voltage power supply circuitry may comprise detector circuitry configured to detect a level, envelope or other parameter of the input signal and to control the power supply voltage provided to the charge pump circuitry based on the detected level, envelope or other parameter.

The charge pump circuitry may comprise one or more supply capacitors, and the switch network may be operable to transfer charge between the reservoir capacitor and the one or more supply capacitors.

In another example, the primary driver circuitry comprises first variable voltage power supply circuitry and the secondary driver circuitry comprises second variable voltage power supply circuitry.

The primary driver circuitry and the secondary driver circuitry may each comprise a switch network and an inductor, and the inductor of the secondary driver circuitry may be smaller than the inductor of the primary driver circuitry.

The inductor of the secondary driver circuitry may be embedded in integrated circuitry that implements the circuitry.

The first variable voltage power supply circuitry may comprise a first reservoir capacitor for storing charge.

The first reservoir capacitor may be shared by the first variable voltage power supply circuitry and the second variable voltage power supply circuitry.

The second variable voltage power supply circuitry may comprise a second reservoir capacitor for storing charge.

The circuitry may further comprise a helper capacitor configured to receive charge from the primary driver circuitry or the secondary driver circuitry in order to adjust a voltage across the helper capacitor.

The Helper Capacitor may be Coupled:
  in series between the piezoelectric transducer and ground; or
  in series between an output of the secondary driver circuitry and a first terminal of the piezoelectric transducer; or
  in parallel with the piezoelectric transducer, between an output of the secondary driver circuitry and ground; or
  in parallel with the piezoelectric transducer, between an output of the primary driver circuitry and ground.

The Circuitry may Comprise:
  a first helper capacitor coupled in parallel with the piezoelectric transducer, between an output of the secondary driver circuitry and ground; and
  a second helper capacitor coupled in parallel with the piezoelectric transducer, between an output of the primary driver circuitry and ground.

The Circuitry may Comprise:
  a first helper capacitor coupled in parallel with the piezoelectric transducer, between an output of the secondary driver circuitry and ground; and
  a second helper capacitor coupled in series between an output of the secondary driver circuitry and a first terminal of the piezoelectric transducer.

The primary driver circuitry may be configured to be coupled to a terminal of the piezoelectric transducer and the secondary driver circuitry may be configured to be coupled to the same terminal of the piezoelectric transducer.

Alternatively, the primary driver circuitry may be configured to be coupled to a first terminal of the piezoelectric transducer and the secondary driver circuitry may be configured to be coupled to a second terminal of the piezoelectric transducer.

The circuitry may further comprise commutation circuitry configured to selectively couple one of a first terminal and a second terminal of the piezoelectric transducer to the primary driver circuitry and the secondary driver circuitry, and to couple the other of the first terminal and the second terminal of the piezoelectric transducer to a reference voltage supply.

The commutation circuitry may be configured to selectively couple one of a first terminal and a second terminal of the piezoelectric transducer to the primary driver circuitry and the secondary driver circuitry, and to couple the other of the first terminal and the second terminal of the piezoelectric transducer to a reference voltage supply based on a polarity of the input signal.

The commutation circuitry may be configured to selectively couple one of the primary driver circuitry and the secondary driver circuitry to a first terminal of the piezoelectric transducer, and to couple the other of the primary driver circuitry and the secondary driver circuitry to a second terminal of the piezoelectric transducer.

The commutation circuitry may be configured to selectively couple the primary driver circuitry and the secondary driver circuitry to the first terminal of the piezoelectric transducer, and to couple the other of the primary driver circuitry and the secondary driver circuitry to the second terminal of the piezoelectric transducer based on a polarity of the input signal.

The circuitry may further comprise first control circuitry for regulating operation of the primary driver and second control circuitry for regulating operation of the secondary driver circuitry. A bandwidth of the second control circuitry may be greater than a bandwidth of the first control circuitry.

The secondary driver circuitry may be selectively operable based on a parameter of the input signal.

The parameter of the input signal may comprise one or more of: a signal level; an envelope; and a frequency of the input signal.

The primary driver circuitry may be selectively operable based on a signal level or envelope of the input signal.

The primary driver circuitry and/or the secondary driver circuitry may be selectively operable based on a mode of operation of the circuitry.

The secondary driver circuitry may be enabled in a first mode in which the input signal comprises an audio signal, and the secondary driver circuitry may be disabled in a second mode in which the input signal comprises a haptic signal or waveform.

In a further example, the primary driver circuitry and the secondary driver circuitry both comprise charge pump circuitry.

In a further example, the primary driver circuitry comprises charge pump circuitry and the secondary driver circuitry comprises variable voltage power supply circuitry.

According to a second aspect the invention provides integrated circuitry comprising the circuitry of the first aspect.

According to a second aspect the invention provides a device comprising the circuitry of the first aspect.

The device may comprise, for example, a mobile telephone, a tablet or laptop computer, a smart speaker, an accessory device, headphones, earphones or earbuds.

BRIEF DESCRIPTION OF THE DRAWINGS

Embodiments of the invention will now be described, strictly by way of example only, with reference to the accompanying drawings, of which.

DETAILED DESCRIPTION

Increasing the power efficiency of circuitry for driving a transducer, without adversely affecting output signal fidelity, is an ever-present design goal, and many different techniques can be employed to increase power efficiency. For example, one concept that may be used in audio applications which use conventional audio output transducers (e.g. diaphragm-based loudspeakers) is the "helper amplifier".

Figure 1:
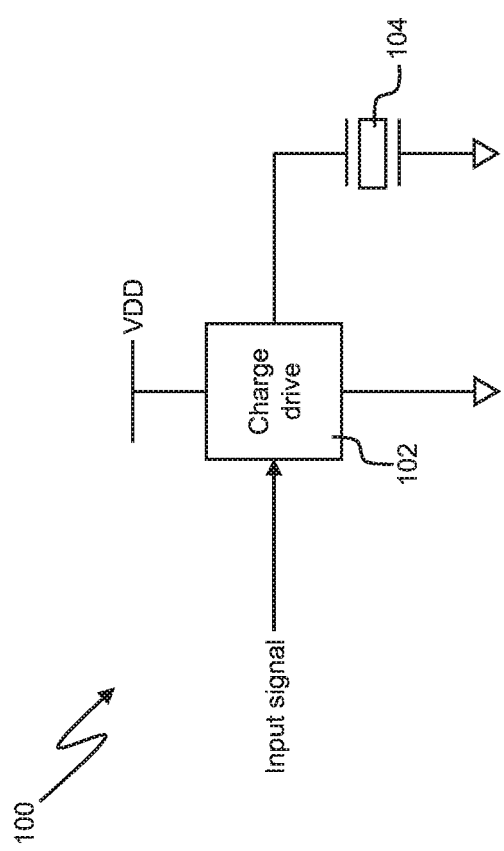
FIG. 1 is a schematic diagram illustrating the concept of driving a piezoelectric transducer with charge.
Figure 2:
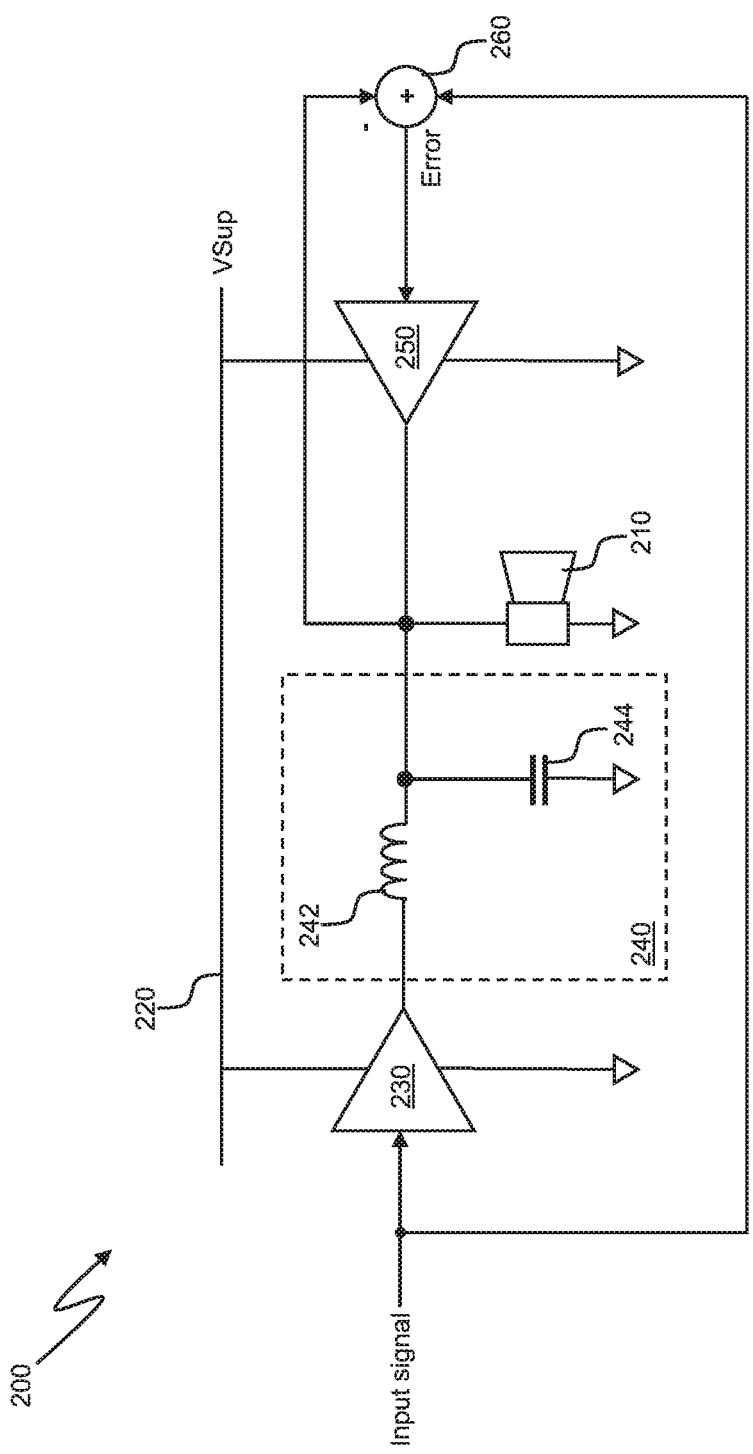
FIG. 2 is a schematic diagram illustrating the concept of a helper amplifier arrangement.

FIG. 2 is a schematic representation of an example helper amplifier arrangement 200 for driving a conventional audio output transducer 210, which in the illustrated arrangement is a loudspeaker.

The example helper amplifier arrangement 200 includes a primary amplifier 220 which receives a positive power supply voltage VSup from a positive power supply rail 220. The primary amplifier 230 may be, for example a switching amplifier such as a class D amplifier, which is configured to receive an audio input signal and to output a digital primary transducer driver signal based on the audio input signal to the transducer 210, via a reconstruction filter 240.

The reconstruction filter 240 is configured to convert the digital primary transducer driver signal output by the primary amplifier 230 into an analogue primary transducer driver signal suitable for driving the transducer 210. The reconstruction filter 240 comprises an inductance 242 coupled in series between an output of the primary amplifier 230 and a first terminal of the transducer 210 and a capacitance 244 coupled in parallel with the transducer 210 between the inductance 242 and a reference voltage supply rail (e.g. a ground rail). A second terminal of the transducer 210 is coupled to a reference voltage supply rail (e.g. a ground rail).

The helper amplifier arrangement 200 further includes a secondary amplifier 250, which may be a linear amplifier such as, for example, a class AB amplifier. The secondary amplifier 250 is configured to receive an error signal output by an error block 260, and to output a secondary transducer driver signal to the transducer 210 based on the error signal.

The error block 260 is configured to receive, at a first input thereof, the input audio signal (or a signal indicative or representative of the input audio signal) and to receive, at a second input thereof, the analogue primary transducer driver signal (or a signal indicative or representative of the analogue primary transducer driver signal), and to generate the error signal based on a difference between the input audio signal input and the analogue primary transducer driver signal.

In use of the helper amplifier arrangement 200 the primary amplifier 230 provides the primary transducer driver signal to the transducer 210 in a power-efficient manner. The primary transducer driver signal provides a majority of the power required to drive the transducer 210 according to the input audio signal. The secondary amplifier 250 provides the secondary transducer driver signal to the transducer 210 to compensate for any error in the analogue primary transducer driver signal. Although the secondary amplifier 250 may be less power-efficient than the primary amplifier 230, its overall effect on the power efficiency of helper amplifier arrangement 200 is small, because the secondary transducer driver signal is small in comparison with the analogue primary transducer driver signal, and so the power drawn from the positive power supply rail 220 by the secondary amplifier 250 is small.

Thus the helper amplifier arrangement 200 can provide a high fidelity output signal for driving the transducer 210 with high power efficiency. However, the helper amplifier arrangement 200 of FIG. 2 is not suited to driving a piezoelectric transducer for a number of reasons, including the problems associated with hysteresis and creep discussed above.

Figure 3:
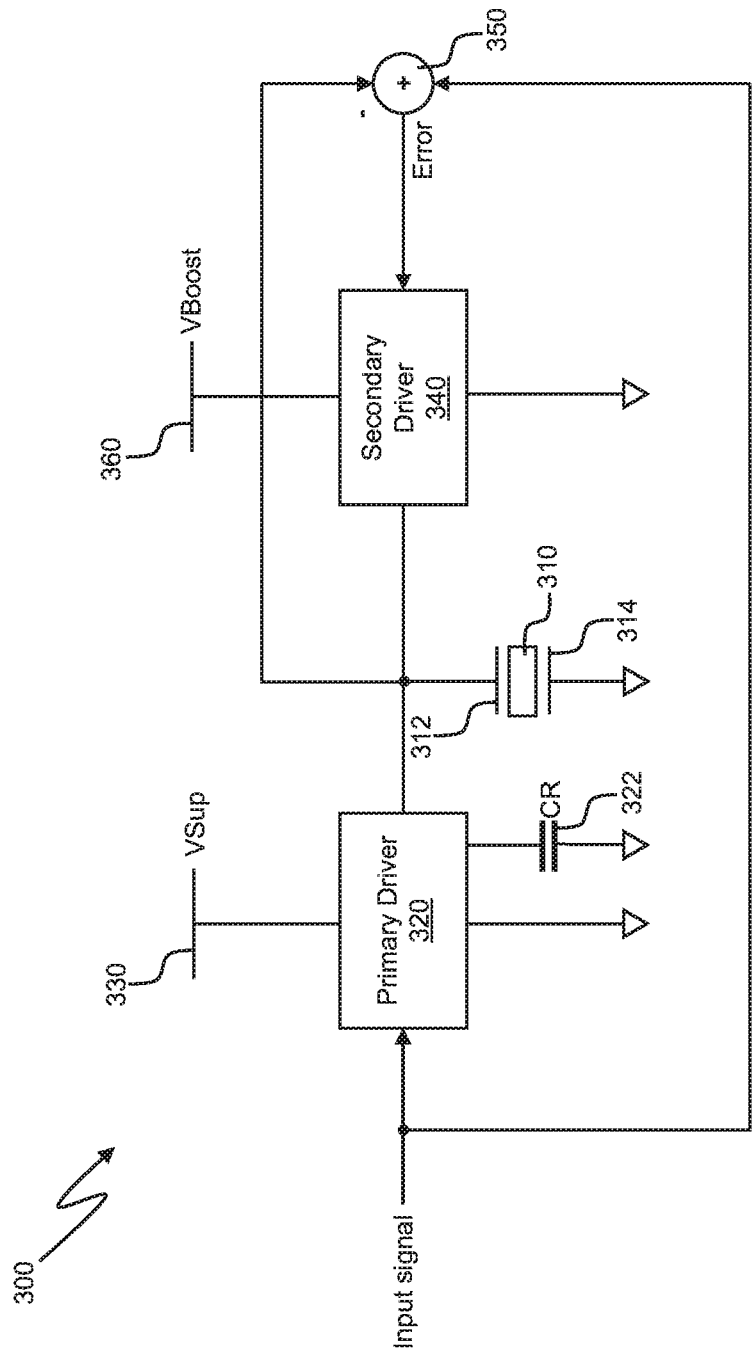
FIG. 3 is a schematic diagram illustrating an example of driver circuitry for driving a piezoelectric transducer.

FIG. 3 is a schematic representation of one example of driver circuitry 300 for driving a piezoelectric transducer 310.

The driver circuitry 300 includes primary driver circuitry 320 for driving the piezoelectric transducer 310. The primary driver circuitry 320 comprises switching converter circuitry and may be, for example, variable voltage power supply circuitry, charge pump circuitry or some other form of switching converter circuitry.

The primary driver circuitry 320 receives a first positive supply voltage VSup from a first positive power supply rail 330 which may be coupled to a source of power such as a battery of a host device incorporating the driver circuitry 300 and the piezoelectric transducer 310, either directly or via a voltage regulator or the like.

The primary driver circuitry 320 is configured to receive an input signal and to output a primary transducer drive signal, based on the input signal, to cause charge to be transferred to and from the piezoelectric transducer 310 to drive the piezoelectric transducer 310. A reservoir capacitance 322 (or a plurality of reservoir capacitances) is provided for storing charge that has been transferred from the piezoelectric transducer 310 to facilitate "recycling" of charge, thereby reducing the need for additional charge to be provided from the positive power supply rail 330.

The driver circuitry 300 further includes secondary driver circuitry 340 for driving the piezoelectric transducer 310. The secondary driver circuitry 340 also comprises switching converter circuitry and may be, for example, variable voltage power supply circuitry, charge pump circuitry or some other form of switching converter circuitry.

Thus, the present disclosure encompasses embodiments of driver circuitry 300 in which the primary driver circuitry and the secondary driver circuitry 320, 340 both comprise variable voltage power supply circuitry, or in which the primary driver circuitry and the secondary driver circuitry 320, 340 both comprise charge pump circuitry, as well as embodiments in which one of the primary driver circuitry and the secondary driver circuitry 320, 340 comprises variable voltage power supply circuitry and the other of the secondary driver circuitry 340 and the primary driver circuitry 320 comprises charge pump circuitry.

The secondary driver circuitry 340 receives a second positive supply voltage VBoost from a second positive power supply rail 360. The second positive power supply rail 360 may receive the second positive power supply voltage VBoost from a boost converter or the like which is configured to generate the second positive supply voltage VBoost from a lower voltage supply such as a supply voltage provided by the battery of the host device.

The driver circuitry 300 further includes an error block 350 configured to receive, at a first input 352 thereof, the input signal (or a signal indicative or representative of the input signal) and to receive, at a second input 354 thereof, a signal indicative or representative of the primary transducer drive signal, e.g. a digital signal output by an ADC 360 representing a voltage across the piezoelectric transducer 310, and to generate an error signal based on the input signal and the primary transducer drive signal.

The secondary driver circuitry 340 is configured to receive the error signal output by the error block 350, and to output a secondary transducer drive signal, based on the error signal, to cause charge to be transferred to and from the piezoelectric transducer 310 in order to compensate for any error between the input signal and the primary transducer drive signal.

In the example illustrated in FIG. 3, an output of the primary driver circuitry 320 is coupled to a first terminal 312 of the piezoelectric transducer 310, and a second terminal 314 of the piezoelectric transducer 310 is coupled to a reference voltage supply rail (e.g. a ground rail). An output of the secondary driver circuitry 330 is also coupled to the first terminal 312 of the piezoelectric transducer 310. Thus the piezoelectric transducer 310 is coupled in parallel with the primary and secondary driver circuitry 320, 340.

In this arrangement, particularly where the piezoelectric transducer 310 is made up of a single layer or a small number of layers of piezoelectric material, the secondary driver circuitry 340 may be required to provide a relatively large output voltage (e.g. of the order of 100V) at its output in order to provide the charge required to compensate for error in the primary transducer driver signal so as to produce the required displacement of the piezoelectric transducer 310. In order to provide the required output voltage the supply voltage VBoost may need to be significantly higher than the output voltage provided by the battery of the host device incorporating the circuitry 300, and thus it may be necessary for the secondary supply voltage VBoost to be provided by a boost converter as described above.

Figure 4:
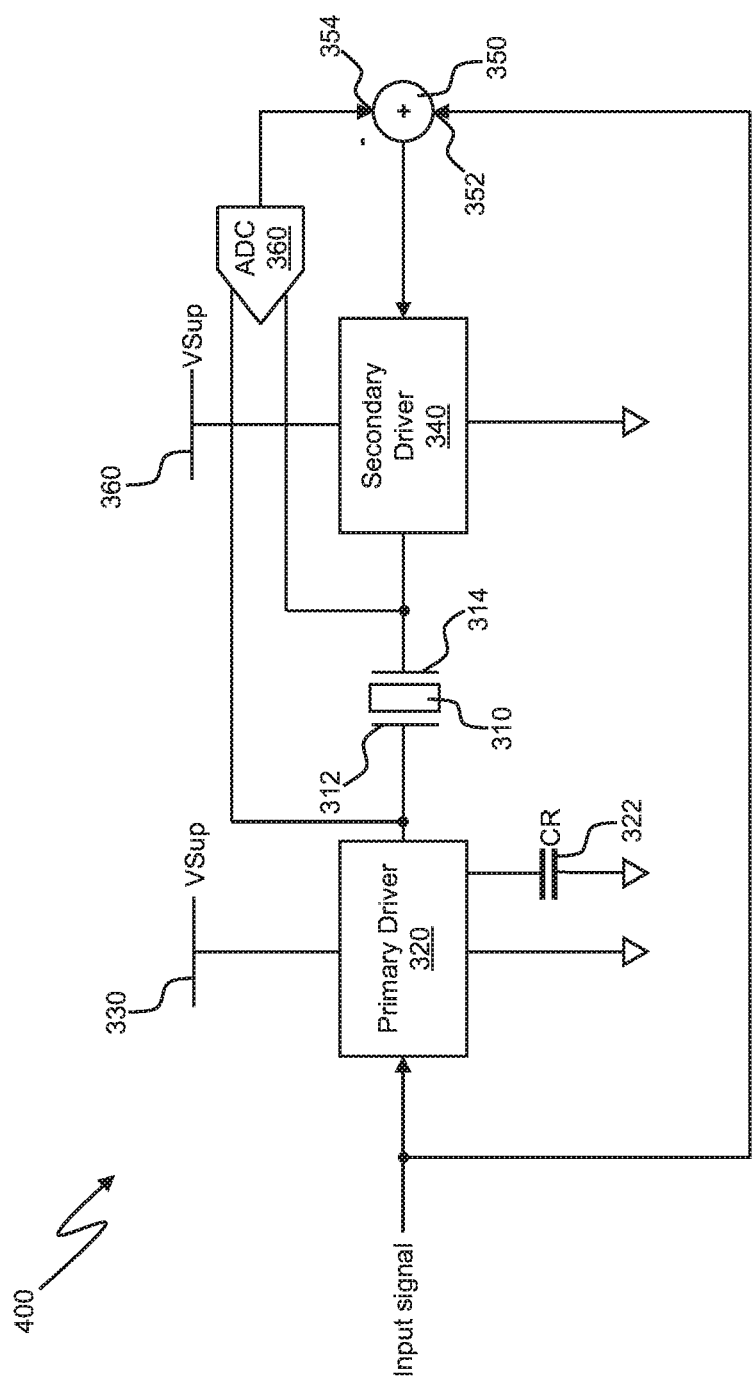
FIG. 4 is a schematic diagram illustrating an alternative example of driver circuitry for driving a piezoelectric transducer.

FIG. 4 is a schematic representation of an alternative example of driver circuitry 400 for driving a piezoelectric transducer 310. The driver circuitry 400 is similar to the driver circuitry 300 of FIG. 3, and thus like elements are denoted by like reference numerals in FIGS. 3 and 4.

The driver circuitry 400 of FIG. 4 differs from the driver circuitry 300 of FIG. 3 in that the output of the primary driver circuitry 320 is coupled to the first terminal 312 of the piezoelectric transducer 320 and the output of the secondary driver circuitry 340 is coupled to the second terminal 314 of the piezoelectric transducer 310. Thus the piezoelectric transducer 310 is coupled in series with the primary driver circuitry and the secondary driver circuitry 340.

An advantage of the series coupling arrangement of the driver circuitry 400 of FIG. 4, as compared to the parallel coupling arrangement of the driver circuitry 300 of FIG. 3, is that, because the voltage across the piezoelectric transducer 310, in use of the driver circuitry 400, is based on the difference between the primary transducer drive signal voltage and the secondary transducer drive signal voltage, a relatively small voltage output by the secondary driver circuitry 340 is sufficient to provide the necessary compensation for error in the primary transducer drive signal. Accordingly the second positive power supply voltage VSup to the secondary driver circuitry 340 need not be high and can thus be provided (directly or indirectly, e.g. via a voltage regulator) by the battery of the host device. As the supply voltage to the secondary driver circuitry 340 is relatively low, it can use low power devices (e.g. transistors) which are physically small, which helps to minimise the silicon area occupied by the secondary driver circuitry 340 in an integrated circuit implementation of the driver circuitry 400.

Figure 5:
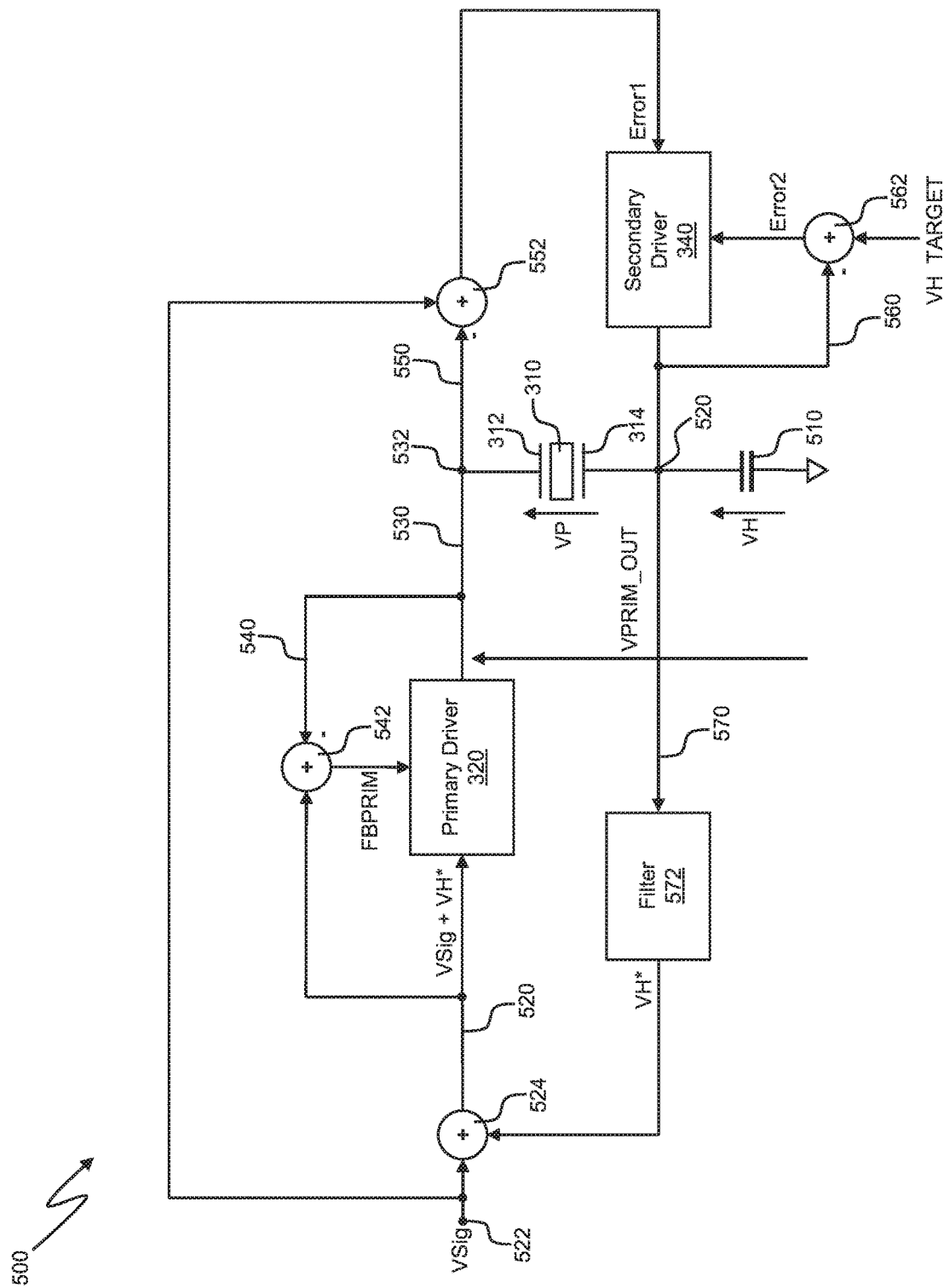
FIG. 5 is a schematic diagram illustrating a further alternative example of driver circuitry for driving a piezoelectric transducer.

FIG. 5 is a schematic representation of a further alternative example of driver circuitry 500 for driving a piezoelectric transducer 310. The driver circuitry 500 is similar in some respects to the driver circuitry 400 of FIG. 4, and thus like elements are denoted by like reference numerals in FIGS. 4 and 5. For the sake of clarity and brevity some elements of the driver circuitry 400 of FIG. 4 are not shown in FIG. 5.

The driver circuitry 500 of FIG. 5 differs from the driver circuitry 400 of FIG. 4 in that it includes a "helper" capacitor 510, coupled between a node 512, which is intermediate the second terminal 314 of the piezoelectric transducer 310 and an output of the secondary driver circuitry 340, and ground. Thus the helper capacitor 510 is coupled in series between the piezoelectric transducer 310 and ground. The capacitance of the helper capacitor 510 may be of the order of ten times the nominal capacitance of the piezoelectric transducer 310.

The driver circuitry 500 includes an input signal path 520 which couples an input node 522 of the driver circuitry 500 to an input of the primary driver circuitry 320. The input signal path 520 includes adder circuitry 524. An output signal path 530 couples an output of the primary driver circuitry 320 to the first terminal 312 of the piezoelectric transducer 310 at a node 532.

A primary driver feedback path 540 couples the output signal path 530 to a first input of first subtractor circuitry 542. A second input of the first subtractor circuitry 542 is coupled to an output of the adder circuitry 524. The first subtractor circuitry 542 is configured to output, to the primary driver circuitry 320, a primary driver feedback signal FBPRIM indicative of the difference between the voltage at the input of the primary driver circuitry 320 and the voltage at the output of the primary driver circuitry 320.

The driver circuitry 500 further includes an error signal path 550, which couples the node 532 to an input of the secondary driver circuitry 320, via second subtractor circuitry 552. A first input of the second subtractor circuitry 552 is coupled to the input node 522 of the input signal path 520, and a second input of the second subtractor circuitry 552 is coupled to the node 532. An output of the second subtractor circuitry 552 is coupled to an input of the secondary driver circuitry 340 so as to provide a first error signal Error1 to the secondary driver circuitry 340.

The driver circuitry 500 further includes a secondary driver feedback path 560, which couples an output of the secondary driver circuitry 340 to the secondary driver circuitry 340, via third subtractor circuitry 562. Thus, the output of the secondary driver circuitry 340 is coupled to a first input of the third subtractor circuitry 562. A second input of the third subtractor circuitry 562 receives a signal indicative of a target voltage VH_TARGET across the helper capacitor 510. The third subtractor circuitry 562 thus outputs, to the secondary driver circuitry 340, a signal indicative of the difference between the target voltage VH_TARGET and the actual voltage VH across the helper capacitor 510.

The driver circuitry 500 further includes a filter signal path 570, which includes a low pass filter 572 having an input coupled to the node 520 and an output coupled to a first input of the adder circuitry 524. A second input of the adder circuitry 524 receives an input voltage VSig representative of a signal (e.g. an audio or haptic signal) to be output by the piezoelectric transducer 310. The adder circuitry 524 is configured to add the signals received at its inputs and to output the result of this addition. Thus, the adder circuitry 324 outputs a signal VSig+VH* (where VH* is a filtered version of the voltage VH across the helper capacitor 510) to the primary driver circuitry 320.

The primary driver circuitry 320 is configured to output a primary voltage VPRIM_OUT, to the piezoelectric transducer 310 to transfer charge to the piezoelectric transducer 310 in order to cause displacement of the piezoelectric transducer 310.

The secondary driver circuitry 340 is configured to selectively charge or discharge the helper capacitor 510 in order to adjust a voltage VH across the helper capacitor 510, to facilitate the transfer of charge to or from the piezoelectric transducer 310 to correct any error in the primary output voltage VPRIM_OUT.

The instantaneous voltage VP across the piezoelectric transducer 310 as a result of the primary voltage VPRIM_OUT is equal to the difference between VPRIM_OUT and VH, i.e. VP=VPRIM_OUT-VH. Thus, the helper capacitor 510 provides a "buffer" voltage VH that can be adjusted upwards or downwards (by appropriate action of the secondary driver circuitry 340) in order to adjust the voltage VP across the piezoelectric transducer 310 to compensate for error in the primary voltage VPRIM_OUT output by the primary driver circuitry 320.

In order for the displacement of the piezoelectric transducer 310 to correctly represent the input signal, the voltage VP should be equal to the voltage VSig. Thus, VPRIM_OUT should be as close as possible to VSig+VH in order for the voltage VP to be equal to VSig (since VP=VPRIM_OUT-VH). As will be appreciated, however, if VH were simply added to VSig, then high-frequency transient changes in VH could lead to undesirable oscillation in the voltage VP. The low-pass filter circuitry 572 is operative to attenuate such high-frequency transients, and to provide the filtered version VH* of the voltage VH, which is added to VSig by the adder circuitry 524.

Thus, in the absence of any error, VPRIM_OUT=VSig+VH*, and VP=VPRIM_OUT-VH≈VSig.

The primary driver circuitry 320 is operative to adjust its output signal VPRIM_OUT based on the primary driver feedback signal FBPRIM to maintain VPRIM_OUT as close to VSig+VH* as possible, thereby minimising error in VPRIM_OUT.

In order to correct any error in the voltage VP (i.e. to correct any difference between VSig and VP), the secondary driver circuitry 340 receives the first error signal Error1, which is indicative of the difference between VP and VSig, from the subtractor circuitry 552, and adjusts the voltage VH across the helper capacitor 510 accordingly, by adding charge to or removing charge from the helper capacitor 510. Thus if VP is greater than VSig, charge can be added to the helper capacitor 510 to increase the voltage VH to compensate. Similarly, if VP is less than VSig charge can be removed from the helper capacitor 510 to reduce the voltage VH to compensate.

As will be appreciated, repeatedly correcting error in VP by reducing the voltage VH across the helper capacitor 510 could eventually lead to the voltage VH being reduced to zero, which would make it impossible to reduce VP further without a negative voltage supply.

To avoid this possibility the secondary driver feedback path 560 provides a second error signal Error2, indicative of the difference between the target voltage VH_TARGET across the helper capacitor 510 and the actual voltage VH across the helper capacitor 510, and the secondary driver circuitry 340 is operative to adjust its output in order to minimise the second error signal Error2 in the long term. Thus the secondary driver circuitry 340 can operate (almost) instantaneously to adjust the voltage VH in order to compensate for error in VPRIM_OUT to achieve the correct VP for a given input signal, but over a longer duration the secondary driver circuitry 340 is operative to maintain the voltage VH across the helper capacitor 510 at the target voltage VH_TARGET, such that after any adjustment in VH to compensate for error in VPRIM_OUT, VH returns to VH_TARGET.

As will be appreciated by those skilled in the art, the control loop implemented by the error signal path 550 should operate more quickly (i.e. have a higher bandwidth) than the control loop implemented by the secondary driver feedback path 560.

Additionally, the control loop implemented by the error signal path 550 should operate more quickly (i.e. have a higher bandwidth) than the control loop implemented by the primary driver feedback path 540, in order to compensate for error in VPRIM_OUT quickly.

More generally, in all of the disclosed examples, a control loop that controls or regulates the operation of the secondary driver circuitry 340 will have a higher bandwidth than a control loop that controls or regulates the operation of the primary driver circuitry 320, in order to compensate quickly for error in the primary driver signal output by the primary driver circuitry 320.

Figure 6:
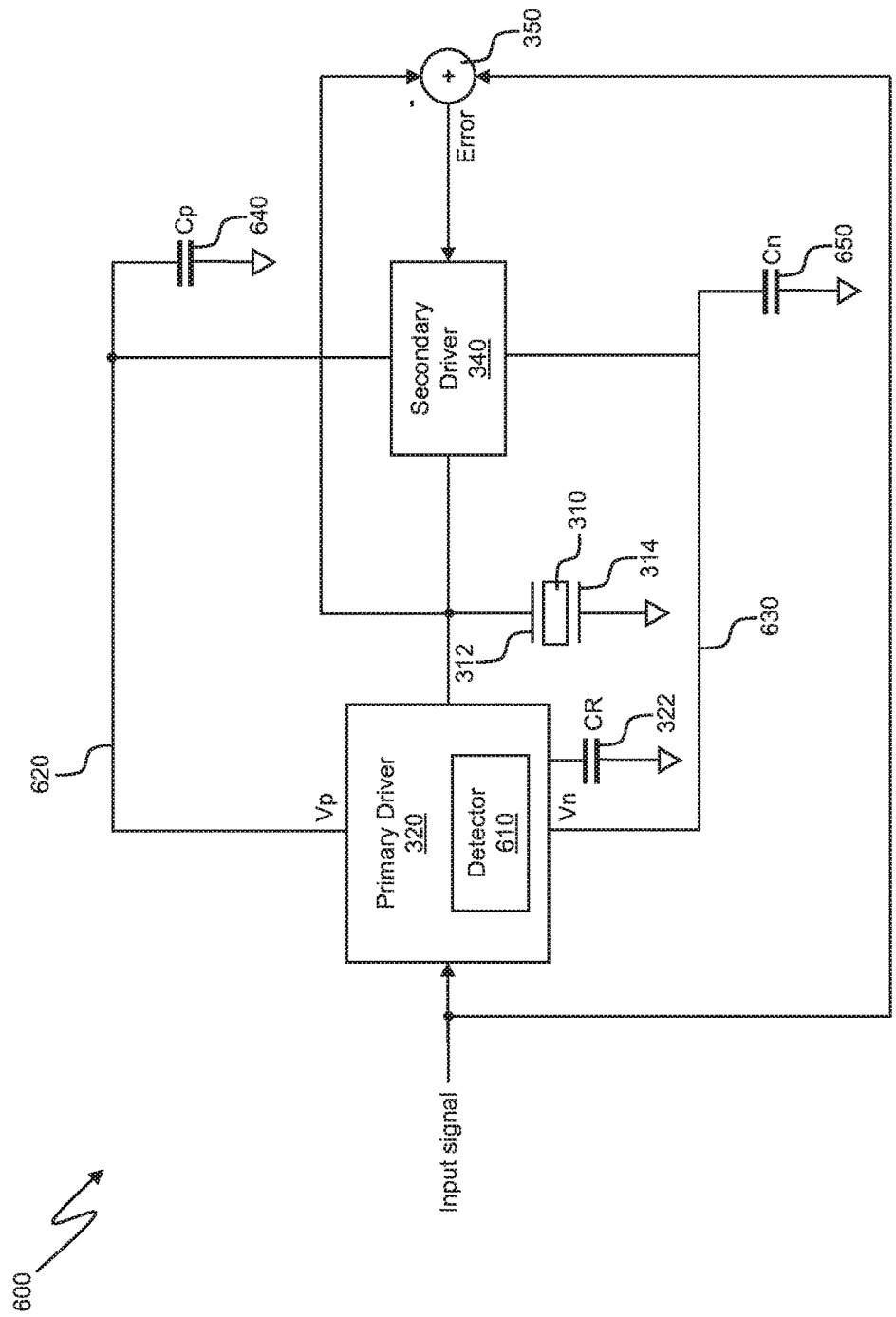
FIG. 6 is a schematic diagram illustrating a further alternative example of driver circuitry for driving a piezoelectric transducer.

FIG. 6 is a schematic representation of an alternative example of driver circuitry 600 for driving a piezoelectric transducer 310. The driver circuitry 600 is similar to the driver circuitry 400 of FIG. 3, and thus like elements are denoted by like reference numerals in FIGS. 3 and 6.

In the driver circuitry 600 of FIG. 6, positive and negative power supply voltages Vp, Vn supplied to the secondary driver circuitry 340 by the primary driver circuitry 320 vary according to a level, envelope or other parameter of the input signal.

To this end, the primary driver circuitry 320, which in this example comprises or implements a variable voltage power supply, as described in detail below with reference to FIG. 8, may include detector circuitry 610 that receives the input signal, detects a signal level (e.g. a magnitude), envelope or some other parameter of the input signal and controls the positive and negative power supply voltages Vp, Vn based on the detected parameter of the input signal. The positive and negative power supply voltages Vp, Vn are supplied to the secondary driver circuitry via respective first (positive) and second (negative) supply voltage rails 620, 630.

The driver circuitry 600 further includes first and second supply capacitors 640, 650. The first supply capacitor 640 (labelled Cp in FIG. 6) is coupled between the first power supply rail 620 and ground, whilst the second supply capacitor 650 (labelled Cn in FIG. 6) is coupled between the second power supply rail 630 and ground.

In the example illustrated in FIG. 6 the primary driver circuitry 320 provides positive and negative voltages Vp, Vn to the secondary driver circuitry 340. However, as will be appreciated by those of ordinary skill in the art, if the secondary driver circuitry 340 were configured to operate on, for example, a ground-referenced power supply, the primary driver circuitry 320 would provide only a positive power supply voltage to the secondary driver circuitry 340. In such an arrangement only a single supply capacitor would be required, coupled between the first (positive) power supply rail 620 and the ground.

The voltage(s) output by the primary driver circuitry 320 are dependent upon the detected signal level, envelope or other parameter of the input signal. Thus, if the detected signal level, envelope or other parameter is indicative that the input signal is increasing, the magnitude of the voltage(s) output by the primary driver circuitry 320 to power the secondary driver circuitry 340 increases. Conversely, if the detected level, envelope or other parameter is indicative that the input signal is decreasing, the magnitude of the voltage(s) output by the primary driver circuitry to power the secondary driver circuitry 340 decreases.

The secondary driver circuitry 340 is coupled to the primary driver circuitry 320 so as to receive the variable positive and negative voltages Vp, Vn as a power supply. The secondary driver circuitry 340 is also operative to receive the error signal output by the error block 350 and to provide a compensating second drive signal to drive the piezoelectric transducer 310, as discussed above.

The use of the variable supply voltage(s) to power the secondary driver circuitry 340 helps to improve the power efficiency of the secondary driver circuitry 340 by reducing or minimising unnecessary headroom in the supply voltage.

The reservoir capacitor 322 and the primary driver circuitry 320 can be used to improve further the power efficiency of the circuitry 600, by transferring charge between the reservoir capacitor 322 and the first and second supply capacitors 640, 650 as the supply requirements of the secondary driver circuitry 340 change.

For example, when the level or envelope of the input signal is decreasing there might be more charge stored in the first and second supply capacitors 640, 650 than is required to supply the secondary driver circuitry 340 in order to provide the compensating second drive signal to the piezoelectric transducer 310. Instead of wasting power by discharging the first and second supply capacitors 640, 650 to ground in this situation, the excess charge can be transferred to the reservoir capacitor 322, using a switch network and an inductor of the primary driver circuitry 320, by first controlling the switch network to establish a current path between the first or second supply capacitor 640, 650 and ground via the inductor so as to cause a magnetic field to develop around the inductor, and then controlling the switch network to decouple the first or second supply capacitor 640, 650 from the inductor and to establish a current path from the inductor to the reservoir capacitor 322, such that as the magnetic field around the inductor collapses a current is induced which flows to the reservoir capacitor 322, thus charging the reservoir capacitor 322.

Conversely, when the level or envelope of the input signal is increasing, an increase in the amount of charge stored in the first and second supply capacitors 640, 650 may be required in order to supply the secondary driver circuitry 340 to support the required output signal level. The required increase can be achieved at least in part by transferring stored charge from the reservoir capacitor 332, again using the switch network and the inductor of the primary driver circuitry 320, by first controlling the switch network to establish a current path between the reservoir capacitor 322 and ground via the inductor so as to cause a magnetic field to develop around the inductor, and then controlling the switch network to decouple the reservoir capacitor 322 from the inductor and to establish a current path from the inductor to the first or second supply capacitor 640, 650, such that as the magnetic field around the inductor collapses a current is induced which flows to the first or second supply capacitor 640, 650, thus charging the first or second supply capacitor 640, 650.

Although in the example shown in FIG. 6 the primary and secondary driver circuitry 320, 340 are coupled in parallel with the piezoelectric transducer 310, those of ordinary skill in the art will appreciate that the principle of powering the secondary driver circuitry 340 using one or more supply voltages which vary according to a signal level, envelope or other parameter of the input signal is equally applicable to the series-coupled arrangement shown in FIGS. 4 and 5, in which the primary and secondary driver circuitry 320, 340 are coupled in series with the piezoelectric transducer 310.

Figure 7:
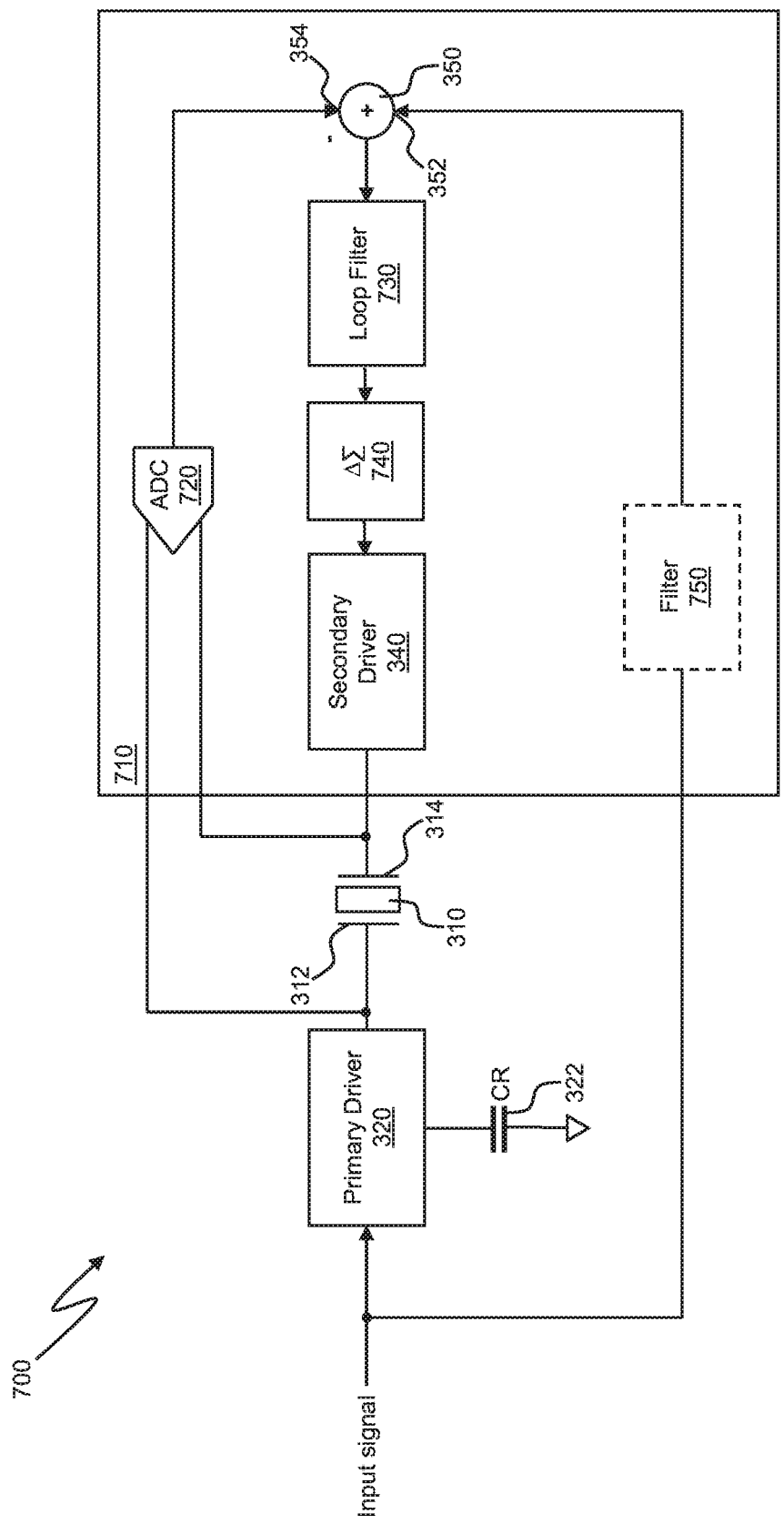
FIG. 7 is a schematic diagram illustrating a control loop for the driver circuitry of FIG. 4.

FIG. 7 is a schematic diagram illustrating driver circuitry 700 including a control loop 710 for the secondary driver circuitry 340. The control loop 710 illustrated in FIG. 7 and described below is applicable to the driver circuitry 300, 400, 500, 600 of FIGS. 3-6.

The driver circuitry 700 is similar to the driver circuitry 400 of FIG. 4, and so like elements are denoted by like reference numerals and will not be described in detail here. The first and second supply rails 330, 360 are not shown in FIG. 7 for reasons of clarity and brevity, but those of ordinary skill in the art will readily appreciate that the primary driver circuitry 320 and the secondary driver circuitry 340 receive respective first and second supply voltages from respective first and second positive supply rails.

The control loop 710 includes an analogue to digital converter (ADC) 720 having an input terminal coupled to the second terminal 314 and an output coupled to the second input 354 of the error block 350. The ADC 720 is configured to convert an analogue signal (e.g. a voltage across the piezoelectric transducer 310) indicative of the charge on the piezoelectric transducer 310 resulting from the primary drive signal output by the primary driver circuitry 320 into a digital signal that is output to the error block 350. The error block 350 receives, at its first input 352, the input signal via a feedforward signal path, and outputs a digital error signal indicative of the difference between the input signal and signal output by the ADC 720 (and thus indicative of an error between the input signal and the primary drive signal output by the primary driver circuitry 320) to a loop filter 730.

The loop filter 730 (which may be, for example, a digital integrator or the like) provides a filtered version of the error signal output by the error block 350 to a delta-sigma digital to analogue converter 740, which in turn outputs a control signal to the secondary driver circuitry 340 to control the operation of the secondary driver circuitry 340 to increase or decrease the charge on the piezoelectric transducer 310 as necessary to compensate for the error between the input signal and the primary drive signal output by the primary driver circuitry 320.

The control loop 710 may also include a filter 750 in the feedforward signal path to the first input 352 of the error block 350, in order to introduce a delay and transfer function to the input signal that correspond to a delay and transfer function of the ADC 620 in the feedback path between the second terminal 314 of the piezoelectric transducer 310 and the second input 354 of the error block 350.

As indicated above in relation to the circuitry 500 of FIG. 5, in order to compensate quickly for error in the primary drive signal output by the primary driver circuitry the control loop 710 should have a greater bandwidth than that of a control loop (not shown) that regulates the operation of the primary driver circuitry 320.

In the examples described above the primary driver circuitry 320 and the secondary driver circuitry 340 are described as operating continuously and simultaneously. In some examples, however, the secondary driver circuitry 340 and/or the primary driver circuitry 320 may be selectively operable (i.e. may be selectively enabled/activated or disabled/deactivated) based on some predetermined condition.

For example, the secondary driver circuitry may be selectively operable based on a parameter of an input signal such as a frequency or a level such as an amplitude or envelope of the input signal.

At low input signal levels the output of the primary driver circuitry 320 may be sufficiently accurate to drive the piezoelectric transducer 310, and thus the secondary driver circuitry 340 may be disabled or deactivated when the input signal level is below a first threshold, to reduce the power consumption of the driver circuitry. At higher input signal levels the primary driver circuitry 320 may not be able to output a sufficiently accurate output signal to drive the piezoelectric transducer 310 accurately, and so if the input signal level meets or exceeds the first threshold, the secondary driver circuitry 340 may be enabled or activated to compensate for error in the primary drive signal output by the primary driver circuitry 320.

Similarly, for input signals within a particular frequency range, the output of the primary driver circuitry 320 may be sufficiently accurate to drive the piezoelectric transducer 310, and thus the secondary driver circuitry 340 may be disabled or deactivated when the input signal frequency is within the particular frequency range, to reduce the power consumption of the driver circuitry. For signals outside the particular frequency range the primary driver circuitry 320 may not be able to output a sufficiently accurate output signal to drive the piezoelectric transducer 310 accurately, and so if the frequency of the input signal moves outside the particular frequency range, the secondary driver circuitry 340 may be enabled or activated to compensate for error in the primary drive signal output by the primary driver circuitry 320.

Additionally or alternatively, in some examples the secondary driver circuitry 340 and/or the primary driver circuitry 320 may be selectively operable in different modes of operation of the driver circuitry. For example when the driver circuitry is operating in a first mode to output an audio signal to the piezoelectric transducer, both the primary driver circuitry 320 and the secondary driver circuitry 340 may both be enabled or activated, whereas when the driver circuitry is operating in a second mode to output a haptic signal or waveform to the piezoelectric transducer, the primary driver circuitry 320 may be enabled or activated and the secondary driver circuitry 340 may be disabled or deactivated, to reduce power consumption.

In still further examples, the output signal power provided by the primary driver circuitry 320 may not be required when the level (e.g. amplitude or envelope) of the input signal is very low. Thus, the primary driver circuitry 320 may be disabled or deactivated when the level or envelope of the input signal is below a second threshold (which may be lower than the first threshold referred to above), such that the secondary driver circuitry 340 drives the piezoelectric transducer 310. The primary driver circuitry 320 may be enabled or activated when the input signal level meets or exceeds the second threshold.

Figure 8:
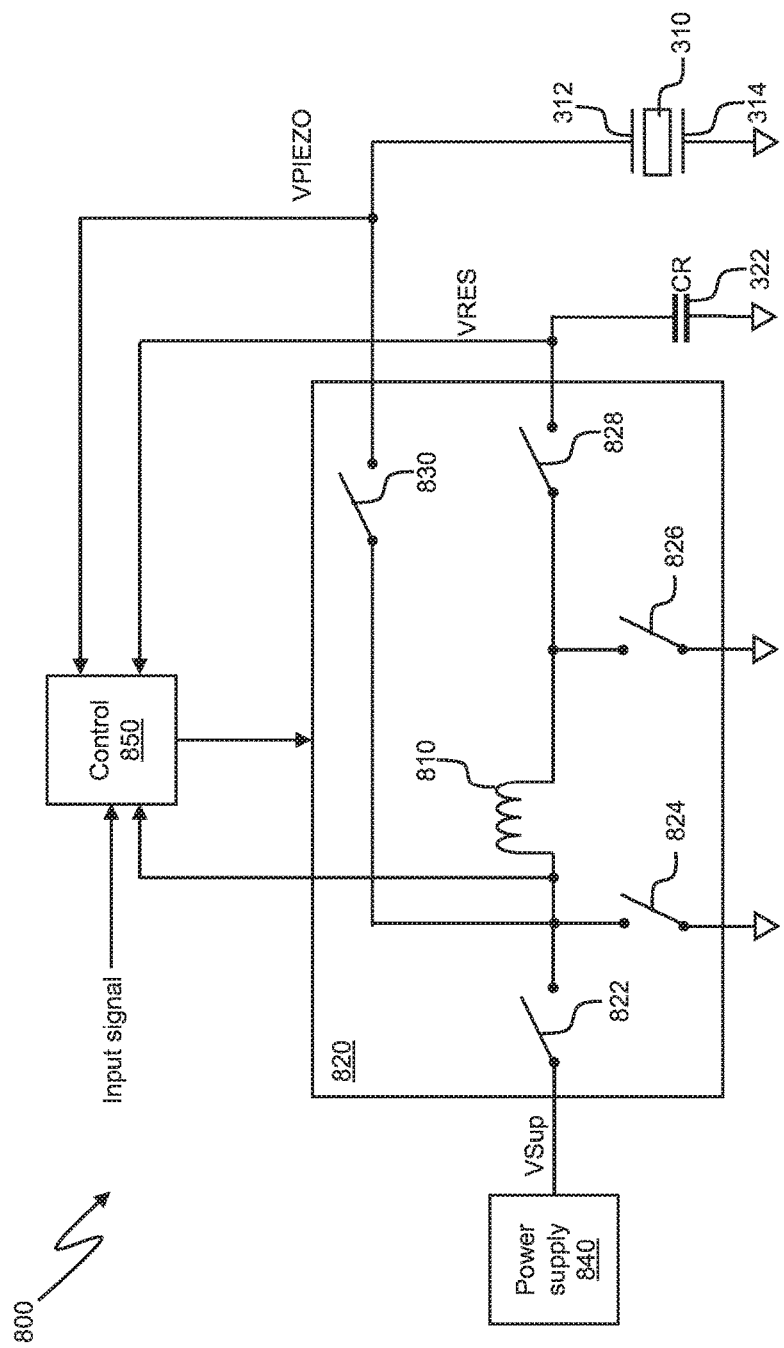
FIG. 8 is a schematic diagram illustrating an example of primary driver circuitry for the driver circuitry of FIGS. 3-7.

FIG. 8 is a schematic representation of example variable voltage power supply circuitry 800 for use as the primary or secondary driver circuitry in the driver circuitry 300, 400, 500, 600.

The variable voltage power supply circuitry 800 includes the reservoir capacitance 322 for storing charge, an inductor 810 and a switch network 820 (in this example comprising first to fifth controllable switches 822-830, which may be, for example, MOSFET devices) for transferring charge between the reservoir capacitance 322 and the piezoelectric transducer 310. The reservoir capacitance 332 is shown in FIG. 8 as a single capacitor, but it will be appreciated that the reservoir capacitance 332 may alternatively be provided by a plurality of capacitors coupled together.

The variable voltage power supply circuitry 800 is configured to receive power from power supply circuitry 840 and to selectively provide charge to the reservoir capacitance 322. The power supply circuitry 840 may comprise boosted power supply circuitry configured to receive a relatively low voltage power supply, e.g. from a battery of the host device, and to output a higher (boosted) power supply voltage VSup.

Although the variable voltage power supply circuitry 800 is shown as including only a single inductor 810 (and this may be preferable, to minimise the number of external components and thus reduce the cost and space requirements of the primary driver circuitry 800), in some examples there may be more than one inductor. For example, a first inductor may be provided for transferring charge from the power supply circuitry 840 to the reservoir capacitance 322 and a second inductor may be provided for transferring charge from the reservoir capacitance 322 to the piezoelectric transducer 310.

Further, where the secondary driver circuitry 340 is implemented using the variable voltage power supply circuitry 800, the inductor 810 may be physically small (since the secondary driver circuitry is required to provide only a relatively small voltage to compensate for error in the output of the primary driver circuitry) and thus, where the secondary power supply circuitry is implemented as integrated circuitry, the inductor 810 may be embedded in the integrated circuitry, rather than being provided as a separate off-chip component.

By contrast, where the primary driver circuitry is implemented using the variable voltage power supply circuitry 800, the inductor 810 is typically physically large, i.e. too large to be embedded in integrated circuitry, (since the primary driver circuitry is required to provide a relatively large output voltage) and thus, where the primary power supply circuitry is implemented as integrated circuitry, the inductor 810 typically cannot be embedded in the integrated circuitry, instead being provided as a separate off-chip component.

The first switching device 822 is coupled between an output of the power supply circuitry 840 and a first terminal the inductor 810.

The second switching device 824 is coupled between the first terminal of the inductor 810 and a reference voltage supply rail (e.g. a ground rail).

The third switching device 826 is coupled between a second terminal of the inductor 810 and the reference voltage supply rail.

The fourth switching device 828 is coupled between the second terminal of the inductor 810 and a first terminal of the reservoir capacitance 332. A second terminal of the reservoir capacitance 332 is coupled to the reference voltage supply rail.

The fifth switching device 830 is coupled between the first terminal of the inductor 810 and a first terminal 312 of the piezoelectric transducer 310. A second terminal 314 of the piezoelectric transducer 310 is coupled to the reference voltage supply rail.

The variable voltage power supply circuitry 800 further includes control circuitry 850, operable to control the switching devices 822-830 to control the transfer of charge between the power supply circuitry 840, the reservoir capacitance 322 and the piezoelectric transducer 310.

On start-up of the variable voltage power supply circuitry 800 (or a host device incorporating the primary driver circuitry 800), charge is transferred from the power supply circuitry 840 to the reservoir capacitance 322 to raise a voltage across the reservoir capacitance 322 to a level that is suitable for driving the piezoelectric transducer 310.

In a first phase of a charging process the first and third switches 822, 826 are closed, in response to appropriate control signals transmitted by the control circuitry 850. This creates a current path through the inductor 810. As current flows through the inductor 810 a magnetic field develops around it, storing energy.

In a second phase of the charging process, the first and third switches 822, 826 are opened and the second and fourth switches 824, 828 are closed, again in response to appropriate control signals transmitted by the control circuitry 850. The magnetic field around the inductor 810 collapses, inducing a current which flows from the inductor 810 to the reservoir capacitance 322, thereby charging the reservoir capacitance 322.

The first and second phases are repeated until the voltage across the reservoir capacitance 322 has increased to a level that is suitable for driving the piezoelectric transducer 310, as determined by the control circuitry 850 based on a feedback signal received from the piezoelectric transducer 310. Once the reservoir capacitance 322 has been charged up to the desired level the first switch 822 is opened, thus decoupling the power supply circuitry 840, such that the piezoelectric transducer 310 can be driven by transferring charge from the reservoir capacitance 322.

When variable voltage power supply circuitry 800 is required to increase the level of charge on the piezoelectric transducer 310, e.g. to drive the piezoelectric transducer 310 to produce a transducer output, the variable voltage power supply circuitry 800 again operates in two phases.

In a first phase of the charge transfer process the second and fourth switches 824, 828 are closed, in response to appropriate control signals transmitted by the control circuitry 850. A current path is therefore established from the reservoir capacitance 322 through the inductor 810. As current flows through the inductor 810 a magnetic field develops around it, storing energy.

In a second phase of the charge transfer process, the fifth switch 830 is closed, and the second and fourth switches 824, 828 are opened, in response to appropriate control signals transmitted by the control circuitry 850. The magnetic field around the inductor 810 collapses, inducing a current which flows from the inductor 810 to the piezoelectric transducer 310, thereby increasing the charge on the piezoelectric transducer 310.

When variable voltage power supply circuitry 800 is required to reduce the level of charge on the piezoelectric transducer 310, charge can be transferred from the piezoelectric transducer 310 to the reservoir capacitance 322, such that the charge remains available for future use, rather than being lost. This improves the efficiency of the primary driver circuitry 800.

The process of transferring charge from the piezoelectric transducer 310 to the reservoir capacitance 322 occurs in two phases.

In a first phase the third and fifth switches 826, 830 are closed, in response to appropriate control signals transmitted by the control circuitry 850. A current path is therefore established from the piezoelectric transducer 310 through the inductor 810. As current flows through the inductor 810 a magnetic field develops around it, storing energy.

In a second phase the second and fourth switches 824, 828 are closed, and the third and fifth switches 826, 830 are opened, in response to appropriate control signals transmitted by the control circuitry 850. The magnetic field around the inductor 810 collapses, inducing a current which flows to the reservoir capacitance 322, thus charging the reservoir capacitance 322.

Thus in variable voltage power supply circuitry 800 the piezoelectric transducer 310 can be driven by transferring charge to it from the reservoir capacitance 322, and charge can be recycled between the piezoelectric transducer 310 and the reservoir capacitance 322 to improve power efficiency. The power supply circuitry 840 provides the initial charge to the reservoir capacitance 322 during the charging process and occasionally or periodically tops up or recharges the reservoir capacitance 322 as necessary.

Figure 9:
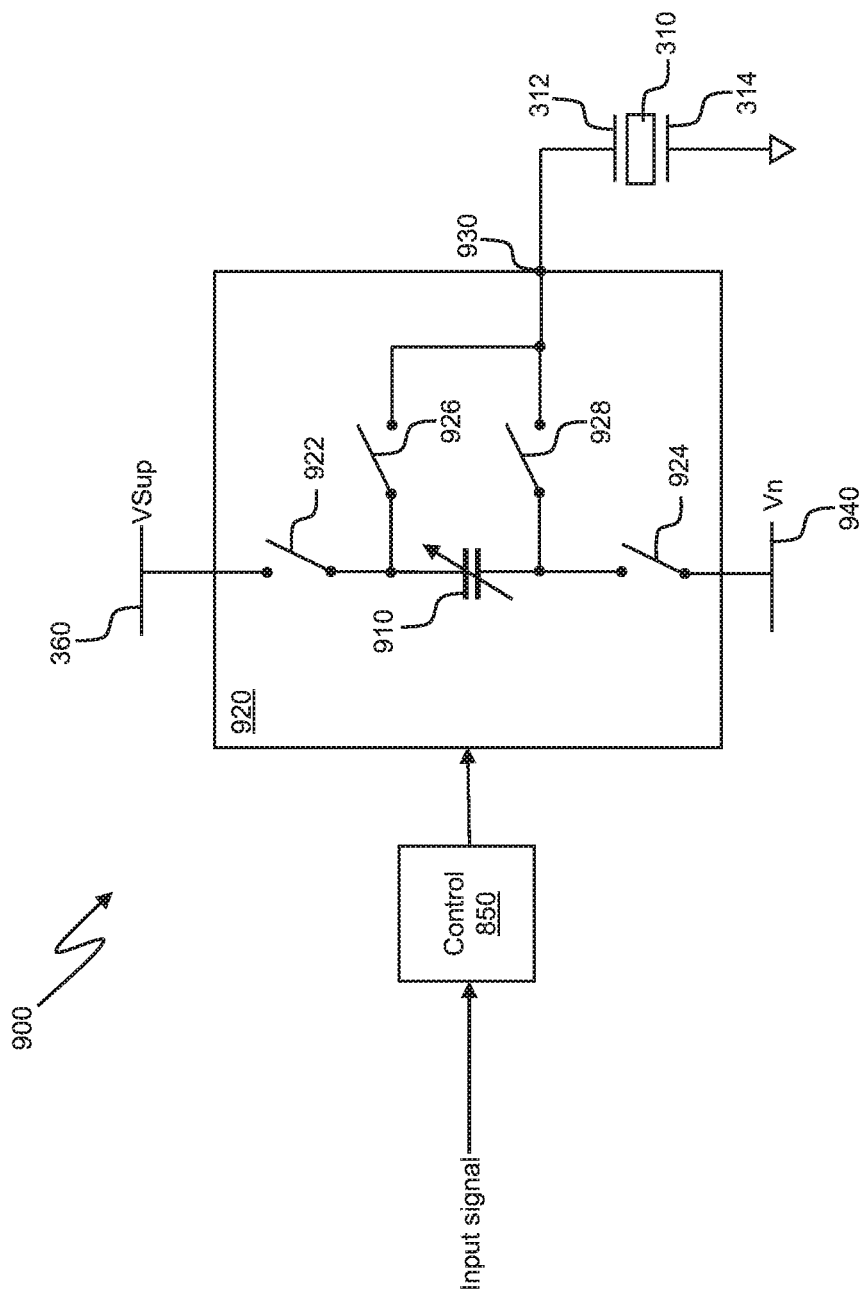
FIG. 9 is a schematic diagram illustrating an example of secondary driver circuitry for the driver circuitry of FIGS. 3-7.

FIG. 9 is a schematic representation of one example of charge pump circuitry 900 for use in the driver circuitry 300, 400, 500, 600.

The charge pump circuitry 900 includes a flying capacitance 910, which may be a fixed capacitor or a variable capacitance (e.g. a bank of capacitances coupled in parallel, each capacitance being selectable by means of one or more switching devices so as to implement a capacitance of a desired value) and a switch network 920 comprising first to fourth controllable switch devices 922-928, which may be, for example, MOSFET devices. An output terminal 930 of the secondary driver circuitry 900 is coupled to the first terminal 312 of the piezoelectric transducer 310.

The first controllable switch device 922 is coupled between the positive supply rail 360 and a first terminal of the flying capacitance 910. The second controllable switch device 924 is coupled between a second terminal of the flying capacitance 910 and a negative supply voltage rail 940. The third controllable switch device 926 is coupled between the first terminal of the flying capacitance 910 and the output terminal 930 of the charge pump circuitry 900, and the fourth controllable switch device 928 is coupled between the second terminal of the flying capacitance 910 and the output terminal 930.

The charge pump circuitry 900 further includes control circuitry 950 which is operative to control the controllable switching devices 922-928 to charge the flying capacitance 910 and to transfer charge to and from the piezoelectric transducer 310 in a manner that will be apparent to those of ordinary skill in the art.

Where the charge pump circuitry 900 is used as the secondary driver circuitry, the flying capacitance 910 can be relatively small, since the secondary driver circuitry is required to provide only a small output voltage to compensate for error in the signal output by the primary driver circuitry. However, where the charge pump circuitry 900 is used as the primary driver circuitry, the flying capacitance 910 is typically much larger, since the primary driver circuitry is required to provide a relatively large output voltages.

Figure 10:
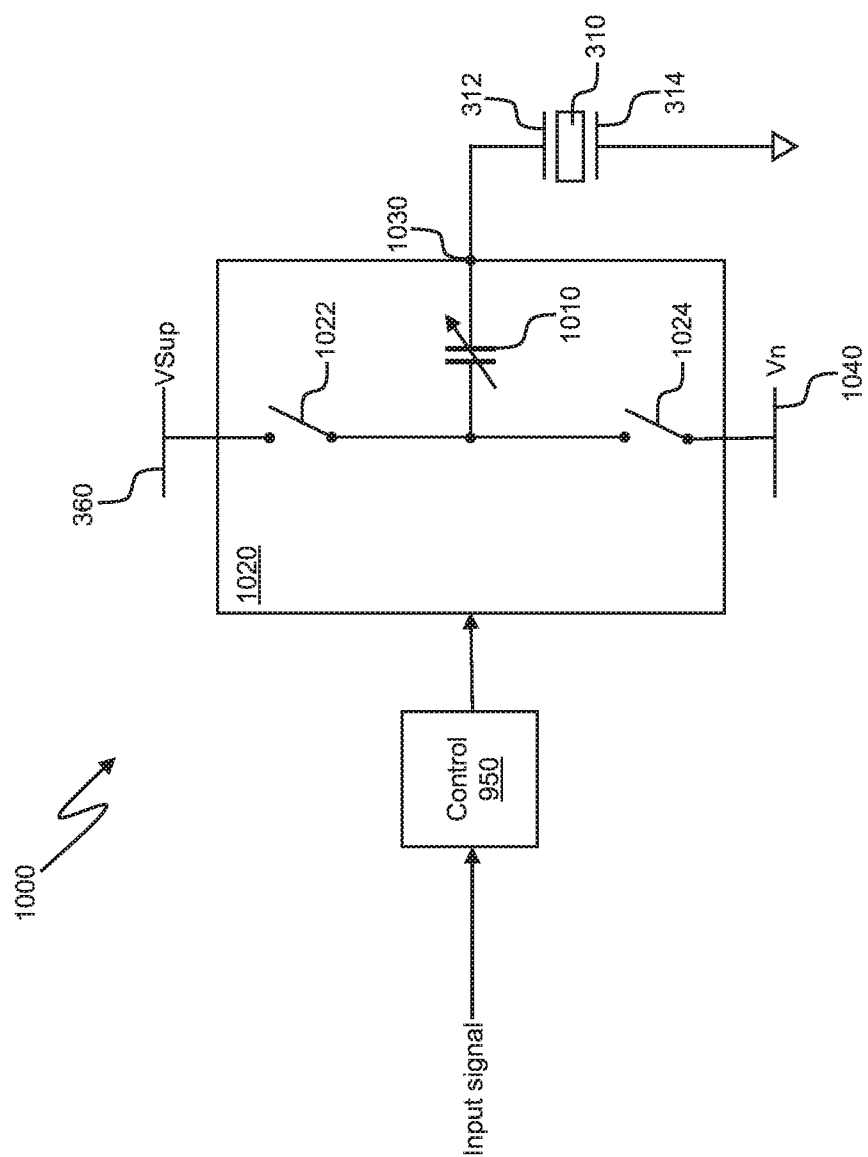
FIG. 10 is a schematic diagram illustrating an alternative example of secondary driver circuitry for the driver circuitry of FIGS. 3-7.

FIG. 10 is a schematic representation of an alternative example of charge pump circuitry 1000 for use in the driver circuitry 300, 400, 500, 600.

The charge pump circuitry 1000 includes a flying capacitance 1010, which again may be a fixed capacitor or a variable capacitance (e.g. a bank of capacitances coupled in parallel, each capacitance being selectable by means of one or more switching devices so as to implement a capacitance of a desired value) and a switch network 1020 comprising first and second controllable switch devices 1022, 1024, which may be, for example, MOSFET devices. An output terminal 1030 of the charge pump circuitry 1000 is coupled to the first terminal 312 of the piezoelectric transducer 310.

The first controllable switch device 1022 is coupled between the positive supply rail 360 and a first terminal of the flying capacitance 1010. The second controllable switch device 1024 is coupled between the first terminal of the flying capacitance 1010 and a negative supply voltage rail 1040.

The charge pump circuitry 1000 further includes control circuitry 1050 which is operative to control the controllable switching devices 1022, 1024 to charge the flying capacitance 1010 and to transfer charge to and from the piezoelectric transducer 310 in a manner that will be apparent to those of ordinary skill in the art.

Again, where the charge pump circuitry 1000 is used as the secondary driver circuitry, the flying capacitance 1010 can be relatively small, since the secondary driver circuitry is required to provide only a small output voltage to compensate for error in the signal output by the primary driver circuitry. However, where the charge pump circuitry 1000 is used as the primary driver circuitry, the flying capacitance 1010 is typically much larger, since the primary driver circuitry is required to provide a relatively large output voltages.

In the examples described above with reference to FIGS. 3 to 6 each of the first and second terminals 312, 314 of the piezoelectric transducer 310 is permanently coupled to either the output of the primary driver circuitry 320, or to the output of the secondary driver circuitry 340 or to the reference voltage (e.g. ground) rail.

Figure 11:
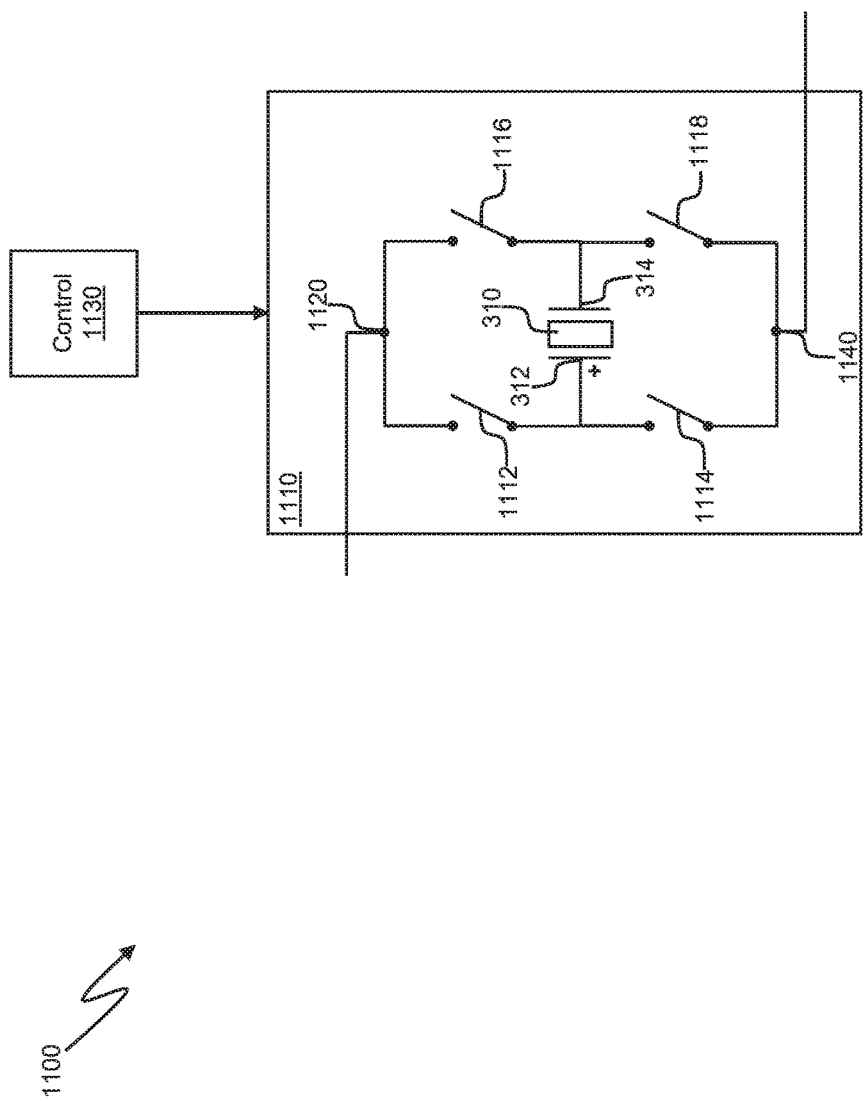
FIG. 11 is a schematic diagram illustrating commutator circuitry that can be used to provide bipolar drive of a piezoelectric transducer.

It may be advantageous, in the series-connected transducer arrangements illustrated in FIGS. 4, 5 and 7, to be able to select which of the terminals 312, 314 of the piezoelectric transducer 310 is coupled to the output of the primary driver circuitry 320 and which is coupled to the output of the secondary driver circuitry 340, e.g. depending upon the polarity of an input signal to the driver circuitry. This can be achieved by using commutator circuitry 1100 coupled to the piezoelectric transducer 310, as will now be described with reference to FIG. 11.

The commutator circuitry 1100 includes a switch network 1100, which in the illustrated example includes first to fourth controllable switches 1112-1118. The commutator circuitry 1100 is coupled to control circuitry 1130 so as to receive control signals for controlling the operation of the controllable switches 1112-1118 according to the input signal.

In use of the commutator circuitry 1100 in implementations which couple the piezo-electric transducer 310 in series with the primary and secondary driver circuitry 320, 340, the first controllable switch 1112 is coupled between a first node 1120 of the switch network 1110 and a first terminal 312 of the piezoelectric transducer 310. The first node 1120 of the switch network 1110 is coupled to an output of the primary driver circuitry 320.

The second controllable switch 1114 is coupled between the first terminal 312 of the piezoelectric transducer 310 and a second node 1140 of the switch network 1110. The second node 1140 of the switch network 1110 is coupled to an output of the secondary driver circuitry 340.

The third controllable switch 1116 is coupled between the first node 1120 of the switch network 1110 and a second terminal 314 of the piezoelectric transducer 310.

The fourth controllable switch 1118 is coupled between the second terminal 314 of the piezoelectric transducer 310 and the second node 1140 of the switch network 1110.

By selectively opening and closing the controllable switches 1112-1118 one of the first and second terminals 312, 314 of the piezoelectric transducer 310 can be coupled to the output of either the primary driver circuitry 320 or the secondary driver circuitry 340, and the other of the first and second terminals 312, 314 of the piezoelectric transducer 310 can be coupled to either the secondary driver circuitry 340 or to the primary driver circuitry 340.

For example, closing the first and fourth switches 1112, 1118 and opening the second and third switches 1114, 1116 will cause the first terminal 312 of the piezoelectric transducer 310 to be coupled to the output of the primary driver circuitry 320 and the second terminal 314 of the piezoelectric transducer 310 to be coupled to the output of the secondary driver circuitry 340. Alternatively, opening the first and fourth switches 1112, 1118 and closing the second and third switches 1114, 1116 will cause the first terminal 312 of the piezoelectric transducer 310 to be coupled to the output of the secondary driver circuitry 340 and the second terminal 314 of the piezoelectric transducer 310 to be coupled to the output of the primary driver circuitry 320.

In the parallel-connected transducer arrangements illustrated in FIGS. 3 and 6, it may be beneficial to be able to select which of the terminals 312, 314 of the piezoelectric transducer 310 is coupled to the outputs of the primary and secondary driver circuitry 320, 340 and which is coupled to ground (or some other reference voltage), e.g. depending upon the polarity of an input signal to the driver circuitry. The commutator circuitry 1100 of FIG. 11 can also be used for this purpose, as will now be described.

In use of the commutator circuitry 1100 in implementations which couple the piezo-electric transducer 310 in parallel with the primary and secondary driver circuitry 320, 340, the first controllable switch 1112 is coupled between a first node 1120 of the switch network 1110 and a first terminal 312 of the piezoelectric transducer 310. The first node 1120 of the switch network 1110 is coupled to an output of the primary driver circuitry 320 and to an output of the secondary driver circuitry 340.

The second controllable switch 1114 is coupled between the first terminal 312 of the piezoelectric transducer 310 and a second node 1140 of the switch network 1110. The second node 1140 of the switch network 1110 is coupled to ground or some other reference voltage supply (e.g. a helper capacitor of the kind described above with reference to FIG. 5).

The third controllable switch 1116 is coupled between the first node 1120 of the switch network 1110 and a second terminal 314 of the piezoelectric transducer 310.

The fourth controllable switch 1118 is coupled between the second terminal 314 of the piezoelectric transducer 310 and the second node 1140 of the switch network 1110.

By selectively opening and closing the controllable switches 1112-1118 one of the first and second terminals 312, 314 of the piezoelectric transducer 310 can be coupled to the outputs of the primary driver circuitry 320 and the secondary driver circuitry 340, and the other of the first and second terminals 312, 314 of the piezoelectric transducer 310 can be coupled to the reference voltage supply (e.g. ground).

For example, closing the first and fourth switches 1112, 1118 and opening the second and third switches 1114, 1116 will cause the first terminal 312 of the piezoelectric transducer 310 to be coupled to the outputs of the primary driver circuitry 320 and the secondary driver circuitry 340, and the second terminal 314 of the piezoelectric transducer 310 to be coupled to the reference voltage supply. Alternatively, opening the first and fourth switches 1112, 1118 and closing the second and third switches 1114, 1116 will cause the first terminal 312 of the piezoelectric transducer 310 to be coupled to the reference voltage supply and the second terminal 314 of the piezoelectric transducer 310 to be coupled to the outputs of the primary driver circuitry 320 and the secondary driver circuitry 340.

In some examples of the driver circuitry disclosed herein, a single reservoir capacitor 322 may be shared between the primary and secondary driver circuitry 320, 340. For example, where both the primary driver circuitry 320 and the secondary driver circuitry 340 comprise variable voltage power supply circuitry 800 of the kind described above with reference to FIG. 8, a single reservoir capacitor 322 may be provided, which is shared by the primary driver circuitry 320 and the secondary driver circuitry 340 for the purpose of charge recirculation. This avoids the need for the primary driver circuitry 320 and the secondary driver circuitry 340 each to have a reservoir capacitor, which reduces the cost and area of the driver circuitry.

In other examples in which both the primary driver circuitry 320 and the secondary driver circuitry 340 comprise variable voltage power supply circuitry 800 of the kind described above with reference to FIG. 8, only the primary driver circuitry 320 may be provided with a reservoir capacitor 332. Again, this reduces the cost and area of the driver circuitry, albeit at the cost of slightly reduced efficiency as charge cannot be recirculated in the secondary driver circuitry 340.

As a further alternative in which both the primary driver circuitry 320 and the secondary driver circuitry 340 comprise variable voltage power supply circuitry 800 of the kind described above with reference to FIG. 8, the primary driver circuitry 320 and the secondary driver circuitry 340 may each be provided with a reservoir capacitor 332. This maximised power efficiency, by permitting charge recirculation in both the primary driver circuitry 320 and the secondary driver circuitry 340, at the cost of increased component count, cost and circuit area.

Figure 12:
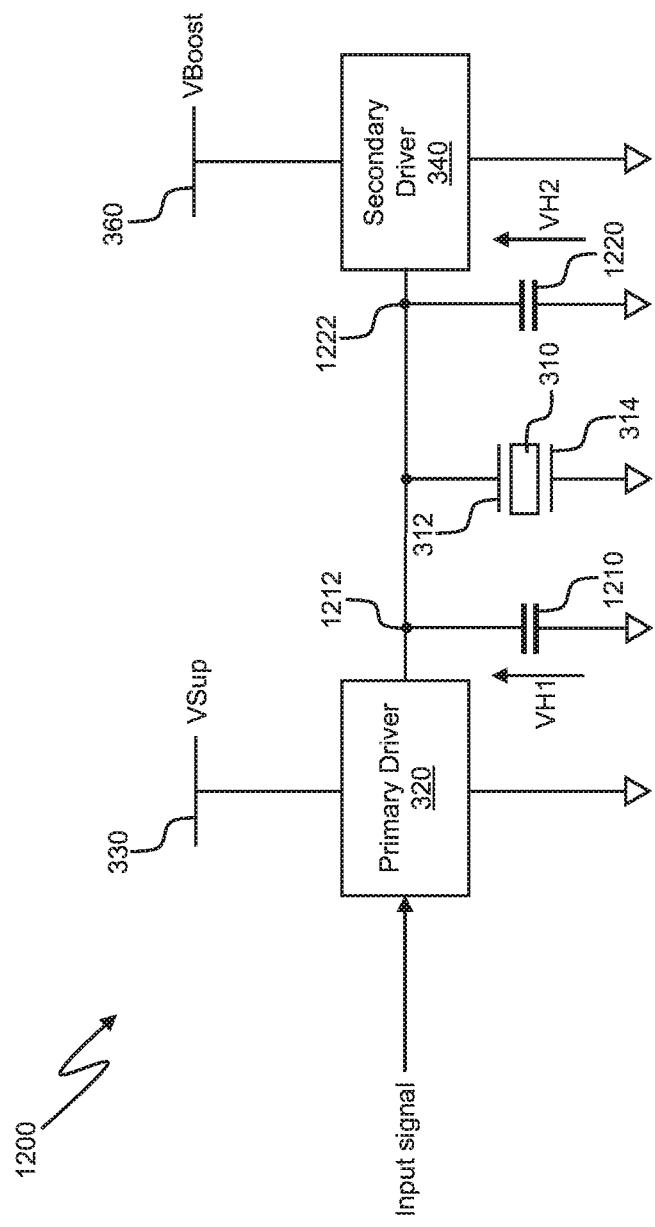
FIGS. 12-16 are schematic diagrams illustrating a further alternative examples of driver circuitry for driving a piezoelectric transducer.

FIG. 12 schematically illustrates an alternative example of driver circuitry 1200 for driving a piezoelectric transducer 310. The driver circuitry 1200 is similar in some respects to the driver circuitry 500 of FIG. 5, and thus like elements are denoted by like reference numerals in FIGS. 5 and 12. For the sake of clarity and brevity some elements of the driver circuitry 500 of FIG. 5 are not shown in FIG. 12.

The driver circuitry 1200 includes first and second "helper" capacitors 1210, 1220. The first helper capacitor 1210 is coupled in parallel with the piezoelectric transducer 310, between a node 1212 intermediate the output of the primary driver circuitry 320 and the first terminal 312 of the piezoelectric transducer 310 and ground. The second helper capacitor 1220 is coupled in parallel with the piezoelectric transducer 310, between a node 1222 intermediate the output of the secondary driver circuitry 340 and the first terminal 312 of the piezoelectric transducer 310 and ground.

The first helper capacitor 1210 can be selectively charged and discharged by the primary driver circuitry 320 in order to adjust a voltage VH1 across the first helper capacitor 1210, to facilitate the transfer of charge to or from the piezoelectric transducer 310 based on the primary driver signal output by the primary driver circuitry 320.

The second helper capacitor 1220 can be selectively charged and discharged by the secondary driver circuitry 340 in order to adjust a voltage VH2 across the second helper capacitor 1220, to facilitate the transfer of charge to or from the piezoelectric transducer 310 to correct any error in the primary driver signal output by the primary driver circuitry 320.

As will be appreciated by those of ordinary skill in the art, the circuitry 1200 includes appropriate input, output, feedback and error and filter signal paths, of the kind described above with reference to FIG. 5, for example, to provide the necessary control of the primary and secondary driver circuitry 320, 340 in order to ensure that the displacement of the piezoelectric transducer 310 represents the input signal to the circuitry 1200 as accurately as possible.

Figure 13:
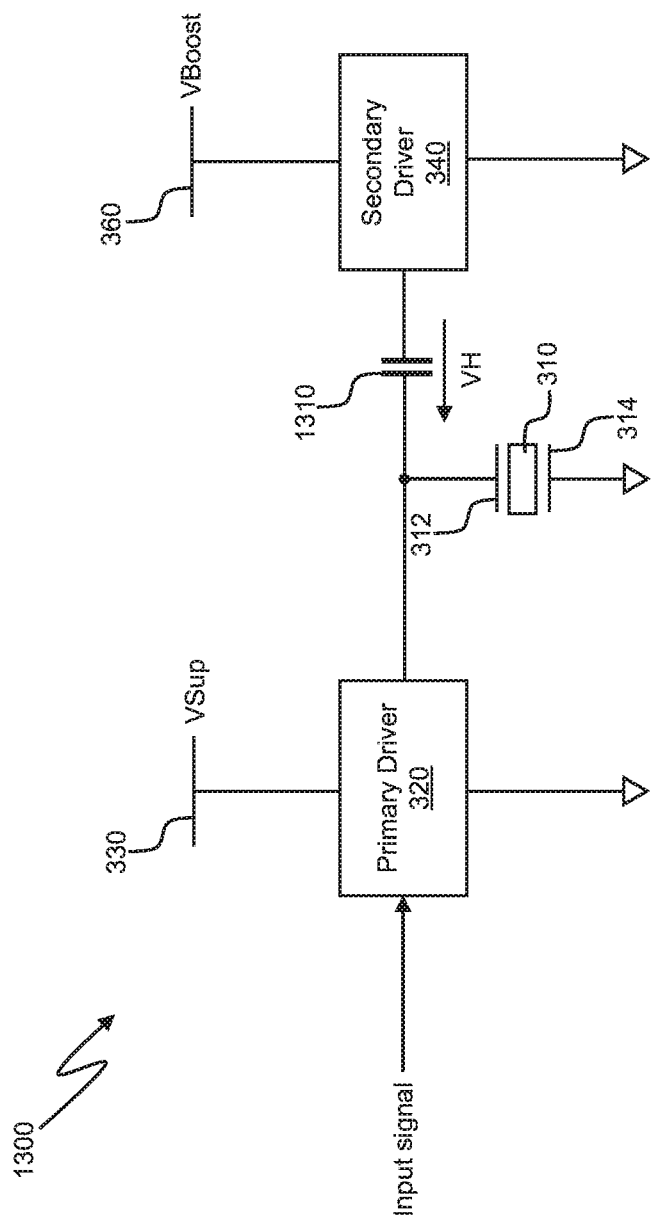

FIG. 13 schematically illustrates a further alternative example of driver circuitry 1300 for driving a piezoelectric transducer 310. The driver circuitry 1300 is similar in some respects to the driver circuitry 400 of FIG. 4, and thus like elements are denoted by like reference numerals in FIGS. 4 and 13. For the sake of clarity and brevity some elements of the driver circuitry 400 of FIG. 4 are not shown in FIG. 13.

The driver circuitry 1300 includes a "helper" capacitor 1310. The helper capacitor 1310 is coupled in series between the output of the secondary driver circuitry 340 and the first terminal 312 of the piezoelectric transducer 310.

The helper capacitor 1310 can be selectively charged and discharged by the secondary driver circuitry 340 in order to adjust a voltage VH across the helper capacitor 1310, to facilitate the transfer of charge to or from the piezoelectric transducer 310 to correct any error in the primary driver signal output by the primary driver circuitry 320.

Again, as will be appreciated by those of ordinary skill in the art, the circuitry 1300 includes appropriate input, output, feedback and error and filter signal paths, of the kind described above with reference to FIG. 5, for example, to provide the necessary control of the primary and secondary driver circuitry 320, 340 in order to ensure that the displacement of the piezoelectric transducer 310 represents the input signal to the circuitry 1300 as accurately as possible.

Figure 14:
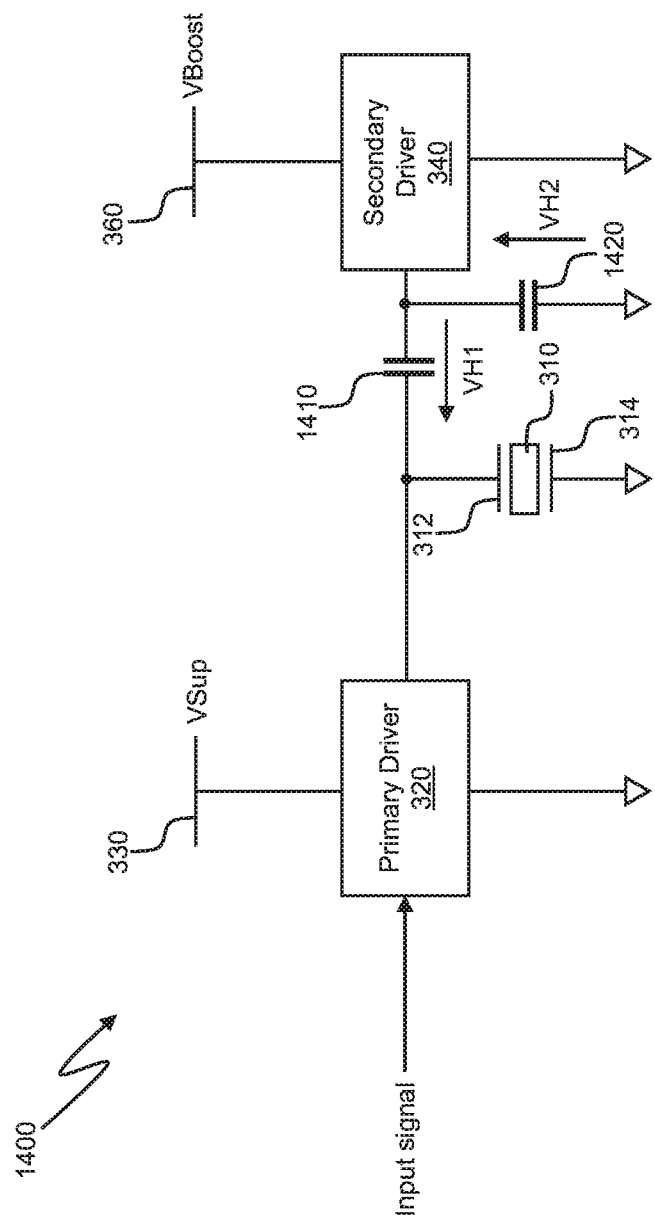

FIG. 14 schematically illustrates a further alternative example of driver circuitry 1400 for driving a piezoelectric transducer 310. The driver circuitry 1400 is similar in some respects to the driver circuitry 1300 of FIG. 13, and thus like elements are denoted by like reference numerals in FIGS. 13 and 14.

The driver circuitry 1400 includes a first "helper" capacitor 1410, which is coupled in series between the output of the secondary driver circuitry 340 and the first terminal 312 of the piezoelectric transducer 310 and ground.

The driver circuitry 1400 further includes a second "helper" capacitor 1420, which is coupled in parallel with the piezoelectric transducer 310, between the output of the secondary driver circuitry 340 and ground.

The first and second helper capacitors 1410, 1420 can be selectively charged and discharged by the secondary driver circuitry 340 in order to adjust voltages VH1, VH2 across the first and second helper capacitors 1410, 1420 respectively, to facilitate the transfer of charge to or from the piezoelectric transducer 310 to correct any error in the primary driver signal output by the primary driver circuitry 320.

Again, as will be appreciated by those of ordinary skill in the art, the circuitry 1400 includes appropriate input, output, feedback and error and filter signal paths, of the kind described above with reference to FIG. 5, for example, to provide the necessary control of the primary and secondary driver circuitry 320, 340 in order to ensure that the displacement of the piezoelectric transducer 310 represents the input signal to the circuitry 1400 as accurately as possible.

Figure 15:
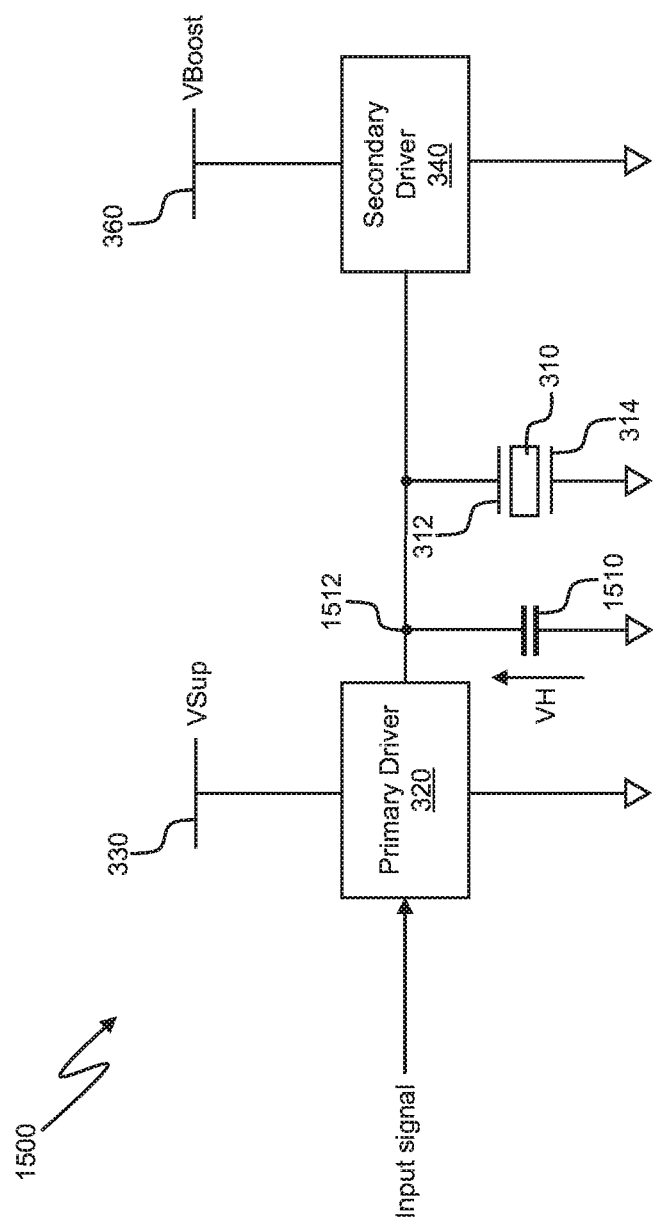

FIG. 15 schematically illustrates a further alternative example of driver circuitry 1500 for driving a piezoelectric transducer 310. The driver circuitry 1500 is similar in some respects to the driver circuitry 1200 of FIG. 12, and thus like elements are denoted by like reference numerals in FIGS. 12 and 15.

The driver circuitry 1500 includes a "helper" capacitor 1510 coupled in parallel with the piezoelectric transducer 310, between a node 1512 intermediate the output of the primary driver circuitry 320 and the first terminal 312 of the piezoelectric transducer 310 and ground.

The helper capacitor 1510 can be selectively charged and discharged by the primary driver circuitry 320 in order to adjust a voltage VH across the helper capacitor 1510, to facilitate the transfer of charge to or from the piezoelectric transducer 310 based on the primary driver signal output by the primary driver circuitry 320.

As will be appreciated by those of ordinary skill in the art, the circuitry 1500 includes appropriate input, output, feedback and error and filter signal paths, of the kind described above with reference to FIG. 5, for example, to provide the necessary control of the primary and secondary driver circuitry 320, 340 in order to ensure that the displacement of the piezoelectric transducer 310 represents the input signal to the circuitry 1500 as accurately as possible.

Figure 16:
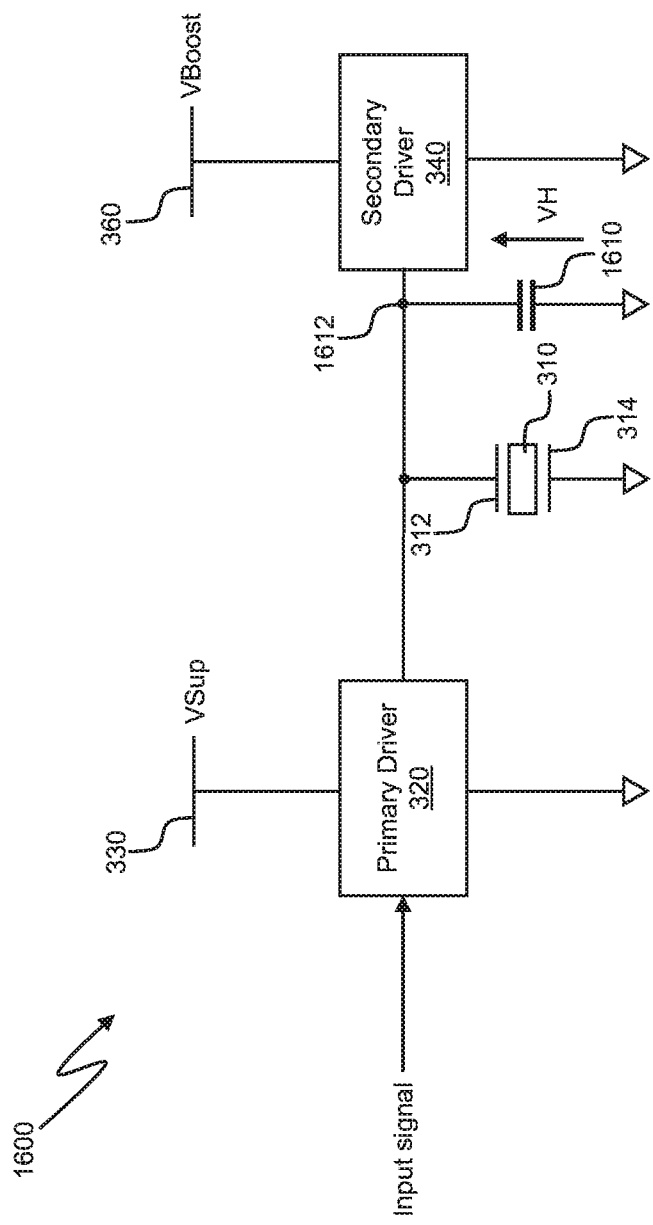

FIG. 16 schematically illustrates a further alternative example of driver circuitry 1600 for driving a piezoelectric transducer 310. The driver circuitry 1600 is similar in some respects to the driver circuitry 1200 of FIG. 12, and thus like elements are denoted by like reference numerals in FIGS. 12 and 16.

The driver circuitry 1600 includes a "helper" capacitor 1610 coupled in parallel with the piezoelectric transducer 310, between a node 1612 intermediate the output of the secondary driver circuitry 340 and the first terminal 312 of the piezoelectric transducer 310 and ground.

The helper capacitor 1610 can be selectively charged and discharged by the secondary driver circuitry 340 in order to adjust a voltage VH across the helper capacitor 1610, to facilitate the transfer of charge to or from the piezoelectric transducer 310 in order to correct any error in the primary driver signal output by the primary driver circuitry 320.

As will be appreciated by those of ordinary skill in the art, the circuitry 1600 includes appropriate input, output, feedback and error and filter signal paths, of the kind described above with reference to FIG. 5, for example, to provide the necessary control of the primary and secondary driver circuitry 320, 340 in order to ensure that the displacement of the piezoelectric transducer 310 represents the input signal to the circuitry 1600 as accurately as possible.

As will be apparent from the foregoing discussion, the circuitry of the present disclosure provides driver circuitry for driving a piezoelectric transducer which includes power-efficient primary driver circuitry for providing a majority of the power required to drive the piezoelectric transducer, and accurate secondary driver circuitry which provides a small (relatively to the primary drive signal provided by the primary driver circuitry) secondary drive signal to correct or compensate, at least partially, for error in the primary drive signal, thus providing accurate and power-efficient driving of the piezoelectric transducer.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for driving a piezoelectric transducer based on an input signal, the circuitry comprising:
   primary driver circuitry configured to receive the input signal and to output a primary driving signal to the piezoelectric transducer based on the input signal; and
   secondary driver circuitry configured to receive an error signal indicative of an error between the input signal and the primary driving signal and to output a secondary driving signal to the piezoelectric transducer based on the error signal,
   wherein the primary driver circuitry and the secondary driver circuitry both comprise switching converter circuitry.

2. Circuitry according to claim 1, wherein the primary driver circuitry comprises variable voltage power supply circuitry and the secondary driver circuitry comprises charge pump circuitry.

3. Circuitry according to claim 2, wherein the variable voltage power supply circuitry comprises a switch network, an inductor and a reservoir capacitor.

4. Circuitry according to claim 2, wherein the charge pump circuitry comprises a switch network and a flying capacitor.

5. Circuitry according to claim 4, wherein the flying capacitor is variable.

6. Circuitry according to claim 4, wherein the charge pump circuitry is configured to receive a power supply that varies based on a parameter of the input signal.

7. Circuitry according to claim 6, wherein the variable voltage power supply circuitry is configured to provide the power supply to the charge pump circuitry.

8. Circuitry according to claim 7, wherein the variable voltage power supply circuitry comprises detector circuitry configured to detect a level, envelope or other parameter of the input signal and to control the power supply voltage provided to the charge pump circuitry based on the detected level, envelope or other parameter.

9. Circuitry according to claim 3, wherein the charge pump circuitry comprises one or more supply capacitors, and wherein the switch network is operable to transfer charge between the reservoir capacitor and the one or more supply capacitors.

10. Circuitry according to claim 1, wherein the primary driver circuitry comprises first variable voltage power supply circuitry and the secondary driver circuitry comprises second variable voltage power supply circuitry.

11. Circuitry according to claim 10, wherein the primary driver circuitry and the secondary driver circuitry each comprise a switch network and an inductor, wherein the inductor of the secondary driver circuitry is smaller than the inductor of the primary driver circuitry.

12. Circuitry according to claim 11, wherein the inductor of the secondary driver circuitry is embedded in integrated circuitry that implements the circuitry.

13. Circuitry according to claim 10, wherein the first variable voltage power supply circuitry comprises a first reservoir capacitor for storing charge.

14. Circuitry according to claim 13, wherein the first reservoir capacitor is shared by the first variable voltage power supply circuitry and the second variable voltage power supply circuitry.

15. Circuitry according to claim 13, wherein the second variable voltage power supply circuitry comprises a second reservoir capacitor for storing charge.

16. Circuitry according to claim 1, further comprising a helper capacitor configured to receive charge from the primary driver circuitry or the secondary driver circuitry in order to adjust a voltage across the helper capacitor.

17. Circuitry according to claim 16, wherein the helper capacitor is coupled:
   in series between the piezoelectric transducer and ground; or
   in series between an output of the secondary driver circuitry and a first terminal of the piezoelectric transducer; or
   in parallel with the piezoelectric transducer, between an output of the secondary driver circuitry and ground; or
   in parallel with the piezoelectric transducer, between an output of the primary driver circuitry and ground.

18. Circuitry according to claim 16, wherein the circuitry comprises:
   a first helper capacitor coupled in parallel with the piezoelectric transducer, between an output of the secondary driver circuitry and ground; and
   a second helper capacitor coupled in parallel with the piezoelectric transducer, between an output of the primary driver circuitry and ground.

19. Circuitry according to claim 16, wherein the circuitry comprises:
   a first helper capacitor coupled in parallel with the piezoelectric transducer, between an output of the secondary driver circuitry and ground; and
   a second helper capacitor coupled in series between an output of the secondary driver circuitry and a first terminal of the piezoelectric transducer.

20. Circuitry according to claim 1, wherein the primary driver circuitry is configured to be coupled to a terminal of the piezoelectric transducer and the secondary driver circuitry is configured to be coupled to the same terminal of the piezoelectric transducer.

21. Circuitry according to claim 1, wherein the primary driver circuitry is configured to be coupled to a first terminal of the piezoelectric transducer and the secondary driver circuitry is configured to be coupled to a second terminal of the piezoelectric transducer.

22. Circuitry according to claim 16, further comprising commutation circuitry configured to selectively couple one of a first terminal and a second terminal of the piezoelectric transducer to the primary driver circuitry and the secondary driver circuitry, and to couple the other of the first terminal and the second terminal of the piezoelectric transducer to a reference voltage supply.

23. Circuitry according to claim 22, wherein the commutation circuitry is configured to selectively couple one of a first terminal and a second terminal of the piezoelectric transducer to the primary driver circuitry and the secondary driver circuitry, and to couple the other of the first terminal and the second terminal of the piezoelectric transducer to a reference voltage supply based on a polarity of the input signal.

24. Circuitry according to claim 22, wherein the commutation circuitry is configured to selectively couple one of the primary driver circuitry and the secondary driver circuitry to a first terminal of the piezoelectric transducer, and to couple the other of the primary driver circuitry and the secondary driver circuitry to a second terminal of the piezoelectric transducer.

25. Circuitry according to claim 24, wherein the commutation circuitry is configured to selectively couple the primary driver circuitry and the secondary driver circuitry to the first terminal of the piezoelectric transducer, and to couple the other of the primary driver circuitry and the secondary driver circuitry to the second terminal of the piezoelectric transducer based on a polarity of the input signal.

26. Circuitry according to claim 1, further comprising first control circuitry for regulating operation of the primary driver and second control circuitry for regulating operation of the secondary driver circuitry, wherein a bandwidth of the second control circuitry is greater than a bandwidth of the first control circuitry.

27. Circuitry according to claim 1, wherein the secondary driver circuitry is selectively operable based on a parameter of the input signal.

28. Circuitry according to claim 27, wherein the parameter of the input signal comprises one or more of: a signal level; an envelope; and a frequency of the input signal.

29. Circuitry according to claim 1, wherein the primary driver circuitry is selectively operable based on a signal level or envelope of the input signal.

30. Circuitry according to claim 1, wherein the primary driver circuitry and/or the secondary driver circuitry is selectively operable based on a mode of operation of the circuitry.

31. Circuitry according to claim 30, wherein the secondary driver circuitry is enabled in a first mode in which the input signal comprises an audio signal, and wherein the secondary driver circuitry is disabled in a second mode in which the input signal comprises a haptic signal or waveform.

32. Circuitry according to claim 1, wherein the primary driver circuitry and the secondary driver circuitry both comprise charge pump circuitry.

33. Circuitry according to claim 1, wherein the primary driver circuitry comprises charge pump circuitry and the secondary driver circuitry comprises variable voltage power supply circuitry.

34. Integrated circuitry comprising the circuitry of claim 1.

35. A device comprising the circuitry of claim 1.

36. A device according to claim 35, wherein the device comprises a mobile telephone, a tablet or laptop computer, a smart speaker, an accessory device, headphones, earphones or earbuds.

* * * * *